(12) United States Patent
Yamada

(10) Patent No.: US 10,305,426 B2
(45) Date of Patent: May 28, 2019

(54) METHOD FOR MANUFACTURING RESONATOR ELEMENT, WAFER, RESONATOR ELEMENT, RESONATOR, OSCILLATOR, REAL-TIME CLOCK, ELECTRONIC APPARATUS, AND MOVING OBJECT

(71) Applicant: SEIKO EPSON CORPORATION, Tokyo (JP)

(72) Inventor: Akinori Yamada, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 484 days.

(21) Appl. No.: 15/014,113

(22) Filed: Feb. 3, 2016

(65) Prior Publication Data
US 2016/0233847 A1   Aug. 11, 2016

(30) Foreign Application Priority Data
Feb. 9, 2015   (JP) ................. 2015-023452

(51) Int. Cl.
*H03H 9/215*   (2006.01)
*H03B 5/30*   (2006.01)

(52) U.S. Cl.
CPC .............. *H03B 5/30* (2013.01); *H03H 9/215* (2013.01)

(58) Field of Classification Search
CPC ............. H03H 9/19; H03H 9/21; H03H 9/215
USPC ....................................................... 310/370
See application file for complete search history.

(56) References Cited

U.S. PATENT DOCUMENTS

| 6,564,639 | B1 * | 5/2003 | Hatanaka | G01C 19/5607 73/504.16 |
|---|---|---|---|---|
| 8,203,256 | B2 * | 6/2012 | Saito | H03H 3/02 310/329 |
| 8,427,035 | B2 | 4/2013 | Yamada | |
| 8,922,286 | B2 * | 12/2014 | Yamada | H03H 9/2489 310/348 |
| 9,088,264 | B2 * | 7/2015 | Yamada | G04F 5/063 |
| 9,178,470 | B2 | 11/2015 | Yamada | |
| 2005/0040737 | A1 * | 2/2005 | Tanaya | H03H 9/1021 310/370 |
| 2009/0021120 | A1 * | 1/2009 | Dalla Piazza | H03H 9/215 310/370 |

(Continued)

FOREIGN PATENT DOCUMENTS

| JP | S53075077 U | 6/1978 |
|---|---|---|
| JP | 2001-264066 A | 9/2001 |

(Continued)

*Primary Examiner* — J. San Martin
(74) *Attorney, Agent, or Firm* — Oliff PLC

(57) ABSTRACT

A method for manufacturing a resonator element includes: an outer shape forming step of etching a substrate to form, in a plan view, a base portion, a pair of vibrating arms extending from the base portion in a first direction, a frame portion surrounding the base portion and the vibrating arms, and a coupling portion coupling the base portion with the frame portion; and a singulation step of cutting the coupling portion to singulate the resonator element. In the outer shape forming step, the coupling portion is formed so as to extend, in the plan view, from only one edge side of the base portion in a direction along a second direction orthogonal to the first direction and be connected with the frame portion.

15 Claims, 31 Drawing Sheets

(56) References Cited

U.S. PATENT DOCUMENTS

| | | | |
|---|---|---|---|
| 2011/0018399 A1* | 1/2011 | Murata | H03H 9/0514 |
| | | | 310/346 |
| 2011/0187232 A1 | 8/2011 | Yamada | |
| 2014/0167870 A1 | 6/2014 | Yamada | |
| 2015/0022276 A1 | 1/2015 | Yamada | |
| 2015/0188513 A1* | 7/2015 | Yamada | G01L 1/106 |
| | | | 331/156 |
| 2016/0260887 A1* | 9/2016 | Fujii | H01L 41/0475 |

FOREIGN PATENT DOCUMENTS

| | | | |
|---|---|---|---|
| JP | 2003-069368 A | 3/2003 | |
| JP | 2003198303 A | 7/2003 | |
| JP | 2005-039780 A | 2/2005 | |
| JP | 2008-131486 A | 6/2008 | |
| JP | 2008-177723 A | 7/2008 | |
| JP | 2009-150678 A | 7/2009 | |
| JP | 2009-152988 A | 7/2009 | |
| JP | 2010-175547 A | 8/2010 | |
| JP | 2011-124976 A | 6/2011 | |
| JP | 2011-160174 A | 8/2011 | |
| JP | 2014-121039 A | 6/2014 | |
| JP | 2015-23423 A | 2/2015 | |

* cited by examiner

METHOD FOR MANUFACTURING RESONATOR ELEMENT, WAFER, RESONATOR ELEMENT, RESONATOR, OSCILLATOR, REAL-TIME CLOCK, ELECTRONIC APPARATUS, AND MOVING OBJECT

BACKGROUND

1. Technical Field

The present invention relates to a method for manufacturing a resonator element, a wafer, a resonator element, a resonator, an oscillator, a real-time clock, an electronic apparatus, and a moving object.

2. Related Art

Electronic devices such as a resonator or an oscillator have been widely used in a small information apparatus such as a HDD (hard disk drive), a mobile computer, or an IC card, or a mobile communication apparatus such as a mobile phone, a car phone, or a paging system.

A resonator element used in the electronic device includes a base portion and a pair of vibrating arms extending from the base portion. The resonator element is obtained by, for example, etching a wafer made of quartz crystal or the like to form an outer shape in which a portion of the base portion is connected to a base material via a break-off portion (coupling portion) and then cutting the break-off portion.

For example, JP-A-2003-198303 discloses a resonator element in which a break-off portion is provided at an edge of a base portion on the side opposite to vibrating arms. Moreover, JP-A-2008-177723 discloses a resonator element in which a break-off portion is provided at both edges of a base portion in a direction in which a pair of vibrating arms are arranged side by side.

In the resonator element disclosed in JP-A-2003-198303, however, when the length of the base portion is shortened for miniaturizing the resonator element with recent demands for miniaturization, stress may be concentrated, in break-off, on the vicinity of a side surface of the base portion on the vibrating arm side. Hence, it may be impossible to achieve miniaturization.

Moreover, in the resonator element disclosed in JP-A-2008-177723, the break-off portion is provided at both edges of the base portion in the direction in which the pair of vibrating arms are arranged side by side. Therefore, compared with the case where the break-off portion is provided at one edge, a resonance frequency F1' of a spurious mode (a flexural vibration mode in which the pair of vibrating arms repeatedly make a flexural motion in the same direction in a plan view) in a wafer state may be remarkably higher than a resonance frequency F1 in a singulated state after break-off from the wafer, due to the fact that the resonator element is firmly fixed to the wafer via the break-off portions (coupling portions).

In contrast, in a main mode (a flexural vibration mode in which the pair of vibrating arms alternately separate from and approach each other repeatedly in the plan view), since the main motion of the flexural vibration of the pair of vibrating arms is a flexural motion in which the pair of vibrating arms are deformed in opposite directions in the plan view, most of motions are canceled out around the base portion, and thus the main mode is less likely to be affected by the break-off portion. Therefore, the resonance frequency F0' in the wafer state is rarely different remarkably from the resonance frequency F0 in the singulated state after break-off from the wafer due to whether the break-off portion is provided at both edges or one edge of the base portion in the direction in which the pair of vibrating arms are arranged side by side (except the difference due to the coupling of the main mode and the spurious mode).

Hence, in the resonator element disclosed in JP-A-2008-177723, if a resonance frequency change due to the coupling of the main mode and the spurious mode is excluded, there is the case where, due to the fact that the difference |F0'−F1'| between the resonance frequency F0' of the main mode and the resonance frequency F1' of the spurious mode measured in the wafer state is remarkably smaller than the difference |F0−F1| between the resonance frequency F0 of the main mode and the resonance frequency F1 of the spurious mode measured in the singulated state after break-off from the wafer, the coupling of the main mode and the spurious mode in the wafer state is remarkably stronger than the coupling of the modes in the singulated state after break-off. The resonance frequency F0' of the main mode in the wafer state is changed by the influence of this coupling.

A change in the strength of this coupling depends on variations in the shape dimensions of the resonator element or break-off portion. Therefore, the difference between F0' and F0 greatly varies according to manufacturing variations in forming the shape of the resonator element or break-off portion. As a result, it is difficult to precisely estimate the resonance frequency F0 after break-off from the resonance frequency F0' in the wafer state. Therefore, accuracy in adjusting the frequency of the main mode in the wafer state is deteriorated, which may lower the yield.

SUMMARY

An advantage according to some aspects of the invention is to provide a method for manufacturing a resonator element by which a resonator element of small size can be manufactured with good yield. Another advantage according to some aspects of the invention is to provide a wafer from which a resonator element of small size can be manufactured with good yield. Still another advantage according to some aspects of the invention is to provide a resonator element manufactured by a method for manufacturing a resonator element by which a resonator element of small size can be manufactured with good yield. Yet another advantage according to some aspects of the invention is to provide a resonator, an oscillator, a real-time clock, an electronic apparatus, and a moving object, all of which include the resonator element.

The invention can be implemented as the following modes or application examples.

APPLICATION EXAMPLE 1

This application example is directed to a method for manufacturing a resonator element including a base portion and a pair of vibrating arms extending from the base portion along a first direction, the method comprising: an outer shape forming step of etching a substrate to form, in a plan view, the base portion, the vibrating arms, a frame portion surrounding the base portion and the vibrating arms, and a coupling portion coupling the base portion with the frame portion; and a singulation step of cutting the coupling portion to singulate the resonator element, wherein in the outer shape forming step, the coupling portion is formed so as to extend, in the plan view, from only one edge side of the base portion in a direction along a second direction orthogonal to the first direction and be connected with the frame portion.

In the method for manufacturing the resonator element, the resonator element of small size can be manufactured with good yield.

APPLICATION EXAMPLE 2

In the method for manufacturing the resonator element according to the application example, in the outer shape forming step, the base portion may be formed such that the base portion includes a first base portion to which the vibrating arms are connected, a second base portion, and a constricted portion interposed between the first base portion and the second base portion and located on the side of the first base portion opposite to the side thereof on which the vibrating arms are connected in the plan view, and that a width of the constricted portion along the second direction is smaller than a width of the first base portion along the second direction and smaller than a width of the second base portion along the second direction.

In the method for manufacturing the resonator element, the resonance frequency of an in-phase flexural vibration mode can be away from the resonance frequency of an opposite-phase flexural vibration mode, and thus it is possible to manufacture the resonator element capable of suppressing the coupling of the in-phase flexural vibration mode and the opposite-phase flexural vibration mode.

APPLICATION EXAMPLE 3

In the method for manufacturing the resonator element according to the application example, the coupling portion may extend from the first base portion.

In the method for manufacturing the resonator element, the resonator element of small size can be manufactured with good yield.

APPLICATION EXAMPLE 4

In the method for manufacturing the resonator element according to the application example, the coupling portion may extend from the second base portion.

In the method for manufacturing the resonator element, the distance between a break-off mark and the vibrating arms can be increased, and thus it is possible to manufacture the resonator element capable of suppressing the unbalance between the vibration of one of the vibrating arms and the vibration of the other vibrating arm due to the break-off mark.

APPLICATION EXAMPLE 5

In the method for manufacturing the resonator element according to the application example, the method may further include a first groove portion forming step of forming, in the coupling portion, a first groove portion along the first direction.

In the method for manufacturing the resonator element, a thinned portion can be formed in the coupling portion, and thus the coupling portion can be easily cut in the singulation step.

APPLICATION EXAMPLE 6

In the method for manufacturing the resonator element according to the application example, an inner surface of the first groove portion may be inclined to a major surface of the base portion.

In the method for manufacturing the resonator element, for example, a resist layer on a metal layer formed on the inner surface of the first groove portion can be easily exposed in photolithography. Due to this, the metal layer formed on the inner surface of the first groove portion can be removed by etching, and thus it is possible to suppress an electrical short circuit between conductive layers serving as a pair of drive electrodes on the inner surface of the first groove portion.

APPLICATION EXAMPLE 7

In the method for manufacturing the resonator element according to the application example, the substrate maybe a quartz crystal substrate, and the edge maybe a surface of the base portion on a positive X-axis direction side of an X-axis as an electrical axis that is a crystal axis of quartz crystal.

In the method for manufacturing the resonator element, the inner surface of the first groove portion can be inclined to the major surface of the base portion by wet etching.

APPLICATION EXAMPLE 8

In the method for manufacturing the resonator element according to the application example, in the outer shape forming step, the vibrating arm may be formed so as to include an arm portion connected to the base portion and a weight portion connected to the arm portion.

In the method for manufacturing the resonator element, it is possible to manufacture the resonator element capable of reducing a thermoelastic loss.

APPLICATION EXAMPLE 9

In the method for manufacturing the resonator element according to the application example, a width of the weight portion along the second direction may be greater than a width of the arm portion along the second direction.

In the method for manufacturing the resonator element, it is possible to manufacture the resonator element capable of reducing a thermoelastic loss.

APPLICATION EXAMPLE 10

In the method for manufacturing the resonator element according to the application example, the method may further include a second groove portion forming step of forming, in the vibrating arm, a second groove portion along the first direction.

In the method for manufacturing the resonator element, it is possible to manufacture the resonator element capable of reducing a thermoelastic loss.

APPLICATION EXAMPLE 11

This application example is directed to a wafer for manufacturing a resonator element including a base portion and a pair of vibrating arms extending from the base portion along a first direction, the wafer including: a frame portion surrounding the base portion and the vibrating arms in a plan view; and a coupling portion coupling the base portion with the frame portion, wherein the coupling portion extends, in the plan view, from only one edge side of the base portion in a direction along a second direction orthogonal to the first direction and is connected to the frame portion.

In the wafer, the resonator element of small size can be manufactured with good yield.

APPLICATION EXAMPLE 12

In the wafer according to the application example, the base portion may include a first base portion to which the vibrating arms are connected, a second base portion, and a constricted portion interposed between the first base portion and the second base portion and located on the side of the first base portion opposite to the side thereof on which the vibrating arms are connected in the plan view, and a width of the constricted portion along the second direction may be narrower than a width of the first base portion along the second direction and smaller than a width of the second base portion along the second direction.

In the wafer, the resonance frequency of the in-phase flexural vibration mode can be away from the resonance frequency of the opposite-phase flexural vibration mode, and thus it is possible to manufacture the resonator element capable of suppressing the coupling of the in-phase flexural vibration mode and the opposite-phase flexural vibration mode.

APPLICATION EXAMPLE 13

In the wafer according to the application example, the coupling portion may extend from the first base portion.

In the wafer, the resonator element of small size can be manufactured with good yield.

APPLICATION EXAMPLE 14

In the wafer according to the application example, the coupling portion may extend from the second base portion.

In the wafer, the distance between a break-off mark and the vibrating arms can be increased, and thus it is possible to manufacture the resonator element capable of suppressing the unbalance between the vibration of one of the vibrating arms and the vibration of the other vibrating arm due to the break-off mark.

APPLICATION EXAMPLE 15

In the wafer according to the application example, the coupling portion may include a first groove portion along the first direction.

In the wafer, a thinned portion can be formed in the coupling portion, and thus the coupling portion can be easily cut in the singulation step.

APPLICATION EXAMPLE 16

In the wafer according to the application example, an inner surface of the first groove portion may be inclined to a major surface of the base portion.

In the wafer, for example, a resist layer on a metal layer formed on the inner surface of the first groove portion can be easily exposed in photolithography. Due to this, the metal layer formed on the inner surface of the first groove portion can be removed by etching, and thus it is possible to suppress an electrical short circuit between conductive layers serving as a pair of drive electrodes on the inner surface of the first groove portion.

APPLICATION EXAMPLE 17

In the wafer according to the application example, the substrate maybe a quartz crystal substrate, and the edge may be a surface of the base portion on a positive X-axis direction side of an X-axis as an electrical axis that is a crystal axis of quartz crystal.

In the wafer, the inner surface of the first groove portion can be inclined to the major surface of the base portion by wet etching.

APPLICATION EXAMPLE 18

In the wafer according to the application example, the vibrating arm may include an arm portion connected to the base portion, and a weight portion connected to the arm portion.

In the wafer, it is possible to manufacture the resonator element capable of reducing a thermoelastic loss.

APPLICATION EXAMPLE 19

In the wafer according to the application example, a width of the weight portion along the second direction may be greater than a width of the arm portion along the second direction.

In the wafer, it is possible to manufacture the resonator element capable of reducing a thermoelastic loss.

APPLICATION EXAMPLE 20

In the wafer according to the application example, the vibrating arm may include a second groove portion along the first direction.

In the wafer, it is possible to manufacture the resonator element capable of reducing a thermoelastic loss.

APPLICATION EXAMPLE 21

This application example is directed to a resonator element including: a base portion; a pair of vibrating arms extending from the base portion along a first direction; and a break-off mark located on only one edge side of the base portion in a direction along a second direction orthogonal to the first direction in the plan view.

The resonator element can be manufactured by a method for manufacturing a resonator element by which a resonator element of small size can be manufactured with good yield.

APPLICATION EXAMPLE 22

In the resonator element according to the application example, the base portion may include a first base portion to which the vibrating arms are connected, a second base portion, and a constricted portion interposed between the first base portion and the second base portion and located on the side of the first base portion opposite to the side thereof on which the vibrating arms are connected in the plan view, and a width of the constricted portion along the second direction may be narrower than a width of the first base portion along the second direction and smaller than a width of the second base portion along the second direction.

In the resonator element, the resonance frequency of the in-phase flexural vibration mode can be away from the resonance frequency of the opposite-phase flexural vibration mode, and thus it is possible to suppress the coupling of the in-phase flexural vibration mode and the opposite-phase flexural vibration mode.

APPLICATION EXAMPLE 23

In the resonator element according to the application example, the break-off mark may be located on the first base portion.

The resonator element can be manufactured by the method for manufacturing the resonator element by which a resonator element of small size can be manufactured with good yield.

APPLICATION EXAMPLE 24

In the resonator element according to the application example, the break-off mark may be located on the second base portion.

In the resonator element, the distance between the break-off mark and the vibrating arms can be increased, and thus it is possible to suppress the unbalance between the vibration of one of the vibrating arms and the vibration of the other vibrating arm due to the break-off mark.

APPLICATION EXAMPLE 25

In the resonator element according to the application example, the break-off mark may include a thinned portion with a thickness thinner than a thickness of the base portion.

The resonator element can be manufactured by the method for manufacturing the resonator element by which a resonator element of small size can be manufactured with good yield.

APPLICATION EXAMPLE 26

In the resonator element according to the application example, the edge may include a portion inclined to a major surface of the base portion.

The resonator element can be manufactured by the method for manufacturing the resonator element by which a resonator element of small size can be manufactured with good yield.

APPLICATION EXAMPLE 27

In the resonator element according to the application example, the edge may be a surface of the base portion on a positive X-axis direction side of an X-axis as an electrical axis that is a crystal axis of quartz crystal.

The resonator element can be manufactured by the method for manufacturing the resonator element by which a resonator element of small size can be manufactured with good yield.

APPLICATION EXAMPLE 28

In the resonator element according to the application example, the vibrating arm may include an arm portion connected to the base portion, and a weight portion connected to the arm portion.

In the resonator element, a thermoelastic loss can be reduced.

APPLICATION EXAMPLE 29

In the resonator element according to the application example, a width of the weight portion along the second direction may be greater than a width of the arm portion along the second direction.

In the resonator element, a thermoelastic loss can be reduced.

APPLICATION EXAMPLE 30

In the resonator element according to the application example, the vibrating arm may include a groove portion along the first direction.

In the resonator element, a thermoelastic loss can be reduced.

APPLICATION EXAMPLE 31

This application example is directed to a resonator including: the resonator element according to the application example; and a package in which the resonator element is contained.

Since the resonator includes the resonator element according to the application example, miniaturization can be achieved.

APPLICATION EXAMPLE 32

This application example is directed to an oscillator including: the resonator element according to the application example; and an oscillation circuit electrically connected with the resonator element.

Since the oscillator includes the resonator element according to the application example, miniaturization can be achieved.

APPLICATION EXAMPLE 33

This application example is directed to a real-time clock including: the resonator element according to the application example; an oscillation circuit electrically connected with the resonator element; and a timing circuit generating date-time data based on a signal output from the oscillation circuit.

Since the real-time clock includes the resonator element according to the application example, miniaturization can be achieved.

APPLICATION EXAMPLE 34

This application example is directed to an electronic apparatus including the resonator element according to the application example.

Since the electronic apparatus includes the resonator element according to the application example, miniaturization can be achieved.

APPLICATION EXAMPLE 35

This application example is directed to a moving object including the resonator element according to the application example.

The moving object can include the resonator element according to the application example.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments described below do not unduly limit the contents of the invention set forth in the appended claims. Moreover, not all of the configurations described below are indispensable configuration requirements of the invention.

1. First Embodiment 1.1. Resonator Element

Figure 1:
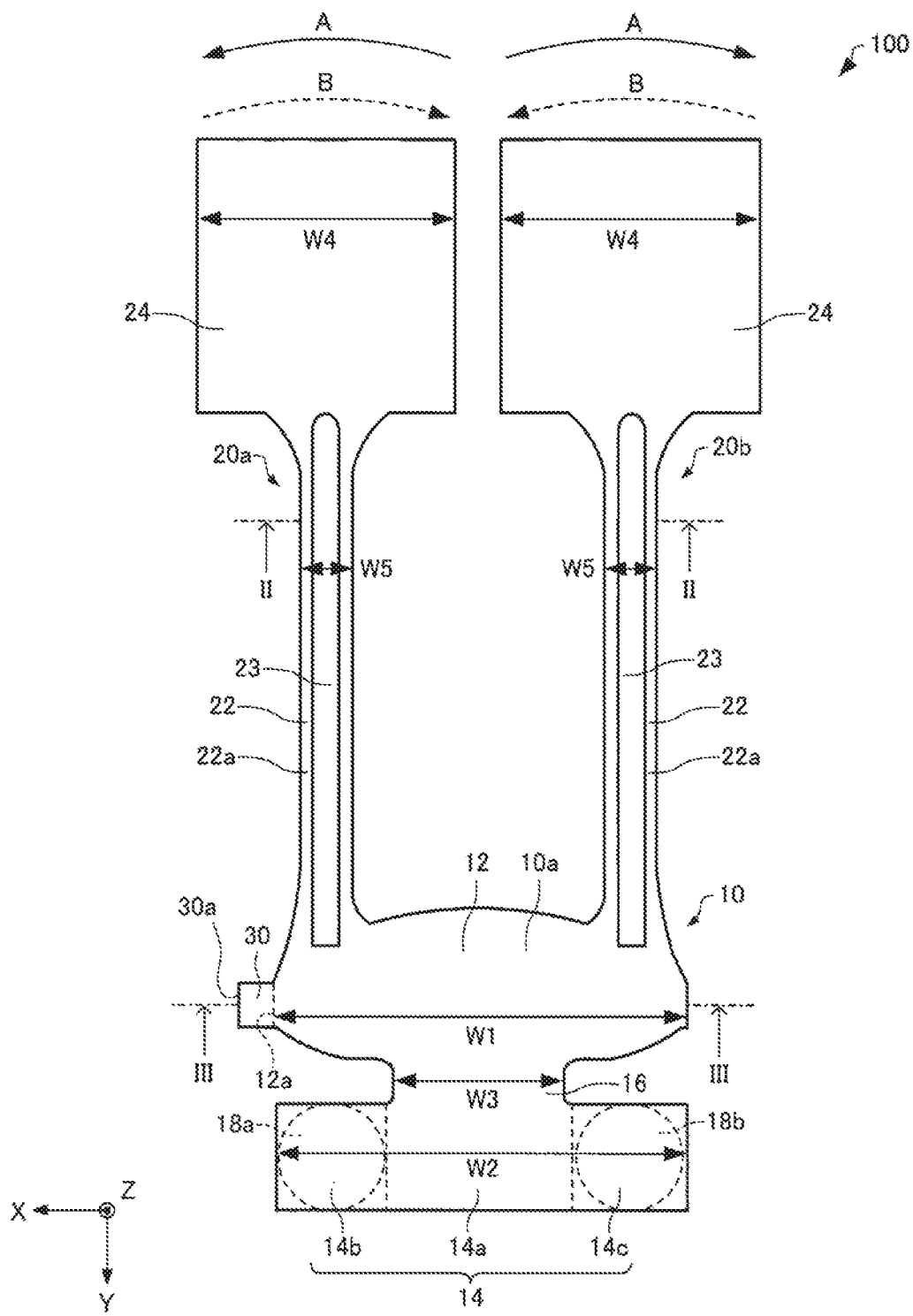
FIG. 1 is a plan view schematically showing a resonator element according to a first embodiment.
Figure 2:
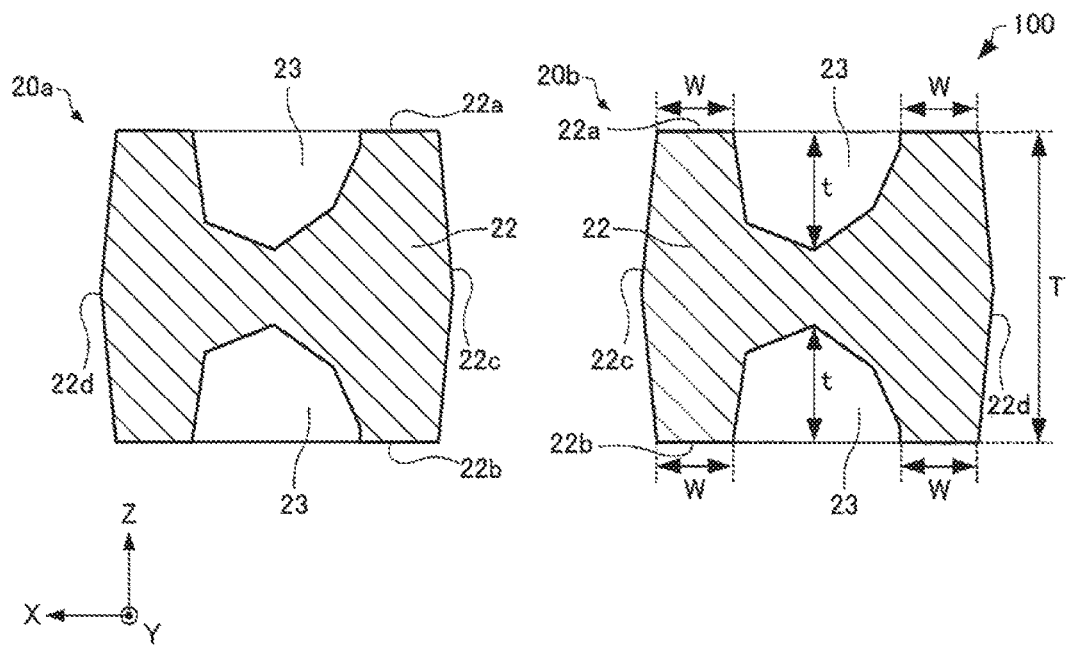
FIG. 2 is a cross-sectional view schematically showing the resonator element according to the first embodiment.
Figure 3:
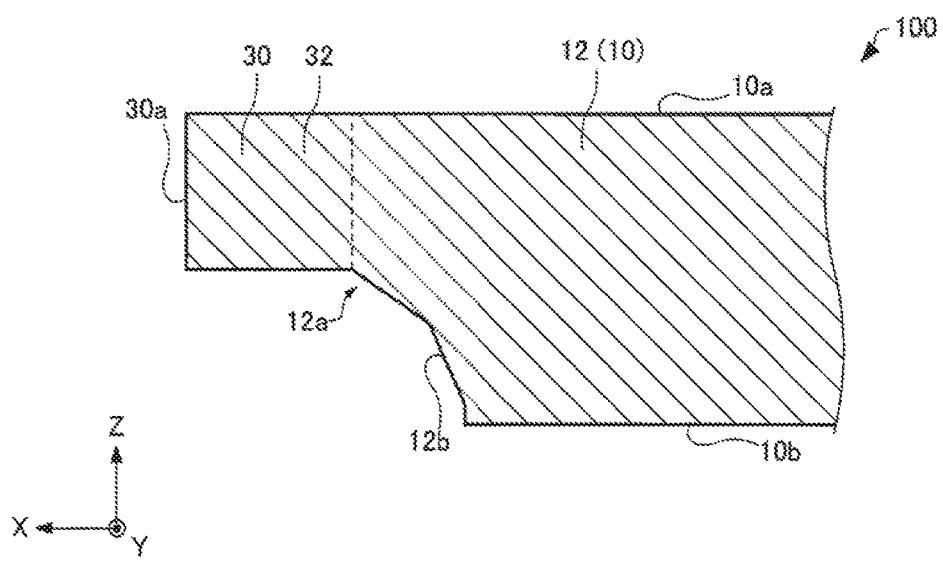
FIG. 3 is a cross-sectional view schematically showing the resonator element according to the first embodiment.

First, a resonator element according to a first embodiment will be described with reference to the drawings. FIG. 1 is a plan view schematically showing the resonator element 100 according to the first embodiment. FIG. 2 is a cross-sectional view schematically showing the resonator element 100 according to the first embodiment, taken along the line II-II of FIG. 1. FIG. 3 is a cross-sectional view schematically showing the resonator element 100 according to the first embodiment, taken along the line III-III of FIG. 1. In FIGS. 1 to 3 and FIGS. 5 to 25 shown below, an X-axis, a Y-axis, and a Z-axis are illustrated as three axes orthogonal to one another.

As shown in FIGS. 1 and 2, the resonator element 100 includes a base portion 10, a pair of vibrating arms 20a and 20b, and a break-off mark 30. The base portion 10 includes a first base portion 12, a second base portion 14, and a constricted portion 16.

The vibrating arms 20a and 20b are connected to the first base portion 12. The vibrating arms 20a and 20b extend from the first base portion 12 along the Y-axis direction (first direction). In the illustrated example, the first base portion 12 has a substantially elliptical shape in a plan view (viewed in the Z-axis direction).

The second base portion 14 is provided on the side (positive Y-axis direction side) of the first base portion 12 opposite to the side thereof on which the vibrating arms 20a and 20b are connected, with the constricted portion 16 between the second base portion 14 and the first base portion 12. In the illustrated example, the second base portion 14 has a rectangular shape in the plan view. A width (maximum width) W2 of the second base portion 14 along the X-axis direction (second direction) is equal to or less than a width (maximum width) W1 of the first base portion 12 along the X-axis direction. The second base portion 14 is set so as to be located on the negative X-axis direction side of a side surface (edge) of a weight portion 24 of the first vibrating arm 20a on the positive X-axis direction side and located on the positive X-axis direction side of a side surface (edge) of a weight portion 24 of the second vibrating arm 20b on the negative X-axis direction side. Therefore, it is possible in the resonator element 100 to suppress an increase in the length of the resonator element 100 in the X-axis direction due to provision of the second base portion 14, and thus miniaturization can be achieved.

The second base portion 14 includes a first portion 14a connected to the constricted portion 16, a second portion 14b provided on the positive X-axis direction side of the first portion 14a, and a third portion 14c provided on the negative X-axis direction side of the first portion 14a. For example, the second portion 14b is fixed to a package via a first conductive bonding member 18a, and the third portion 14c is fixed to the package via a second conductive bonding member 18b. Since the second portion 14b and the third portion 14c are fixed to the package, the resonator element 100 can be mounted on the package in a balanced manner.

The conductive bonding members 18a and 18b are, for example, an epoxy-based, silicone-based, polyimide-based, acrylic-based, or bismaleimide-based conductive adhesive mixed with a conductive substance such as a metal filler, a metal bump such as a gold, aluminum, or solder bump, a metal layer, a resin bump having metal wiring formed on a core made of a resin, or a lead wire. In the illustrated example, the shape of the conductive bonding members 18a and 18b is circular in the plan view, but the shape is not particularly limited and may be, for example, rectangular.

The width W2 of the second base portion 14 along the x-axis direction is greater than the length of the second base portion 14 along the Y-axis direction. In this manner, by reducing the length of the second base portion 14 along the Y-axis direction, the length of the first base portion 12 along the Y-axis direction can be increased by the amount corresponding to the reduction, so that a thermoelastic loss (vibration energy loss caused by the heat conduction occurring between compression and expansion portions of the resonator element that flexurally vibrates) can be reduced. For example, when the first vibrating arm 20a and the second vibrating arm 20b are flexurally deformed so as to approach each other in the plan view, the temperature rises due to the occurrence of compression deformation in the vicinity of an edge face of the first base portion 12 on the negative Y-axis side. In contrast, the temperature falls due to the occurrence of expansion deformation in the vicinity of a side surface where the first base portion 12 and the constricted portion 16 form an outline in the plan view and the first base portion 12 and the constricted portion 16 are connected, so that a temperature gradient is produced to thereby cause heat conduction. When the first vibrating arm 20a and the second vibrating arm 20b are flexurally deformed so as to separate from each other in the plan view, compression deformation and expansion deformation are replaced each other and, accordingly, temperature rise and temperature fall are replaced each other, so that heat conduction in the opposite direction from the above is caused. These types of heat conduction are alternately repeated, so that a thermoelastic loss occurs. Especially in a heat insulating area (an area where the resonance frequency of the flexural vibration is higher than a thermal relaxation frequency), it is known that the thermoelastic loss becomes small as a heat conduction path is longer. Therefore, by increasing the length of the first base portion 12 along the Y-axis direction, the thermoelastic loss due to the heat conduction described above can be reduced (see Patent Document: JP-A-2011-124976, etc.).

The constricted portion 16 is provided between the first base portion 12 and the second base portion 14. The constricted portion 16 is connected to the base portions 12 and 14. In the illustrated example, the constricted portion 16 has a substantially rectangular shape in the plan view. A width (maximum width) W3 of the constricted portion 16 along the x-axis direction is smaller than the width W1 and smaller than the width W2.

The vibrating arms 20a and 20b extend side by side with each other from the base portion 10 along the negative Y-axis direction. In the illustrated example, the first vibrating arm 20a is provided on the positive X-axis direction side, and the second vibrating arm 20b is provided on the negative X-axis direction side. The vibrating arms 20a and 20b each include an arm portion 22 connected to the base portion 10 and the weight portion 24 connected to the arm portion 22.

A bottomed groove portion 23 is provided on each of major surfaces (major surfaces in opposing relationship to each other) 22a and 22b of the arm portions 22 of the vibrating arms 20a and 20b orthogonal to the Z-axis. The groove portion 23 extends along the Y-axis direction in the plan view. In the illustrated example, the tip end of the groove portion 23 is located at the boundary between the arm portion 22 and the weight portion 24. As shown in FIG. 2, the arm portion 22 has a substantially H-shape in cross section. A distance W between the groove portion 23 and side surfaces 22c and 22d (inner side surface 22c and outer side surface 22d) of the vibrating arms 20a and 20b is preferably 6 μm or less. Further, which is expressed by the relation: 2t/T where t is the maximum depth of the groove portion 23 and T is the thickness (length along the Z-axis direction) of the vibrating arms 20a and 20b, is preferably 0.6 or more. Due to this, the equivalent series resistance, that is, the CI (Crystal Impedance) value of the resonator element 100 can be reduced, and lower power consumption can be achieved.

The length of the groove portion 23 along the Y-axis direction is not particularly limited. For example, the groove portion 23 may be provided also in the weight portion 24, or may be provided also in the base portion 10.

The weight portion 24 of the vibrating arms 20a and 20b has a substantially flat-plate shape. In the illustrated example, a width W4 of the weight portion 24 along the X-axis direction is greater than a width W5 of the arm portion 22 along the X-axis direction. The ratio of the width W4 to the width W5 (W4/W5) is 2 or more and 10 or less, and preferably 5 or more and 7 or less. Due to this, it is possible to suppress vibration leakage due to the torsion of the weight portion while reducing the thermoelastic loss.

The shape of a weight portion according to the invention is not particularly limited as long as the mass per unit length is greater than that of the arm portion. For example, the weight portion may have a shape with the same width as the width of the arm portion and a thickness thicker than that of the arm portion. Moreover, the weight portion may be configured by providing a metal such as gold on a surface of the vibrating arm corresponding to the weight portion or in a recess formed in the surface. Further, the weight portion may be composed of a substance having a mass density higher than that of the arm portion. That is, it is sufficient that all of the arm portions or all of the weight portions satisfy the relation: Ma<Mb where Ma and Mb are the masses per unit length (length in the Y-axis direction) of the arm portion and the weight portion, respectively.

The break-off mark 30 is provided on only one of two side surfaces of the base portion 10, which cross (specifically, orthogonal to) the X-axis direction in the plan view and are in opposing relationship to each other. In the illustrated example, the break-off mark 30 is provided on a side surface (surface directed to the positive X-axis direction in the example shown in FIG. 1) 12a of the first base portion 12 on the positive X-axis direction side. The side surface 12a is a surface of the first base portion 12 on the positive X-axis direction side of the X-axis as an electrical axis that is a crystal axis of quartz crystal. As shown in FIG. 3, the side surface 12a includes an inclined portion 12b that is inclined to major surfaces (major surfaces in opposing relationship to each other) 10a and 10b of the base portion 10 orthogonal to the Z-axis. As will be described later, the break-off mark 30 is a portion of a coupling portion that is connected to the base portion 10 when the coupling portion is cut to singulate the resonator element.

As shown in FIG. 1, a side surface 30a of the break-off mark 30 on the positive X-axis direction side is located at the same position with respect to the X-axis direction as the side surface (edge) of the second base portion 14 on the positive X-axis direction side, or located on the positive X-axis direction side of the side surface (edge) of the second base portion 14 on the positive X-axis direction side. The break-off mark 30 is located on the negative X-axis direction side of the side surface (edge) of the weight portion 24 of the first vibrating arm 20a on the positive X-axis direction side. Therefore, it is possible in the resonator element 100 to suppress an increase in the length of the resonator element 100 in the X-axis direction due to provision of the break-off mark 30, and thus miniaturization can be achieved.

The breakoff mark 30 includes a thinned portion 32 with a thickness thinner than the thickness of the base portion 10. In the example shown in FIG. 3, the entire break-off mark 30 is the thinned portion 32. That is, the thickness of the break-off mark 30 is thinner than the thickness of the base portion 10. The side surface 30a of the break-off mark 30 on the positive X-axis direction side is a surface formed by cutting the coupling portion. The side surface 30a is a flat surface in the illustrated example, but may have a concavo-convex shape.

The base portion 10, the vibrating arms 20a and 20b, and the break-off mark 30 (hereinafter also referred to as "vibrating arms 20a and 20b and the like") of the resonator element 100 are integrally provided. Specifically, the vibrating arms 20a and 20b and the like are formed in a single quartz crystal wafer (quartz crystal substrate) that is cut from rough quartz crystal (lumbered quartz crystal) at a predetermined angle (for example, a quartz crystal wafer obtained by rotating a Z-plate whose thickness direction is the Z-axis (optical axis) of quartz crystal about the X-axis (electrical axis) in the range from 0 degrees to 15 degrees), using techniques such as photolithography and etching.

Without being limited to the quartz crystal wafer, the vibrating arms 20a and 20b and the like may be formed of, for example, aluminum nitride (AlN), an oxide substrate such as lithium niobate ($LiNbO_3$), lithium tantalate ($LiTaO_3$), lead zirconate titanate (PZT), lithium tetraborate ($Li_2B_4O_7$), or langasite crystal ($La_3Ga_5SiO_{14}$), a stacked piezoelectric substrate configured by stacking a piezoelectric material such as aluminum nitride or tantalum pentoxide ($Ta_2O_5$) on a glass substrate, or a piezoelectric ceramic substrate. Moreover, the vibrating arms 20a and 20b and the like may be formed using a silicon semiconductor material or the like.

Next, the operation of the resonator element 100 will be described.

A pair of drive electrodes (not shown) are formed on each of the vibrating arms 20a and 20b. An electrode pad electrically connected with one of the pair of drive electrodes is formed on the second portion 14b of the second base portion 14, and an electrode pad electrically connected with the other of the pair of drive electrodes is formed on the third portion 14c of the second base portion 14. As the drive electrode and the electrode pad, for example, a stacked layer in which chromium or nickel is used as an under layer and a metal layer such as gold or silver is stacked on the under layer is used.

In the resonator element 100, an electric field is generated by a drive signal (alternating voltage) externally applied to the drive electrodes via the electrode pads. Then, due to an inverse piezoelectric effect of quartz crystal, a flexural vibration occurs in which the vibrating arms 20a and 20b are displaced with the root portion thereof as a supporting point so as to bend alternately in the directions of the arrows A (directions in which the vibrating arms 20a and 20b are away from each other) and in the directions of the arrows B (directions in which the vibrating arms 20a and 20b approach each other) shown in FIG. 1 (the vibrating arms 20a and 20b vibrate in an opposite-phase mode in the X-axis direction).

The vibrating (driving) method of a resonator element according to the invention is not limited to the piezoelectric driving. For example, a resonator element according to the invention may be an electrostatically driven resonator element using an electrostatic force or a Lorentz-driven resonator element using a magnetic force, other than a piezoelectrically driven resonator element using a piezoelectric substrate.

The resonator element 100 has, for example, the following features.

The resonator element 100 includes the constricted portion 16 provided between the first base portion 12 and the second base portion 14. Therefore, in the resonator element 100, the resonance frequency of an X-axis-direction in-phase flexural vibration mode (a flexural vibration mode in which the pair of vibrating arms sequentially repeat displacement such that the pair of vibrating arms are simultaneously displaced in the positive X-axis direction and then displaced in the negative X-axis direction, i.e., a spurious mode) can be away from the resonance frequency of an X-axis-direction opposite-phase flexural vibration mode (a flexural vibration mode in which the pair of vibrating arms sequentially repeat displacement such that one of the pair of vibrating arms is displaced in the positive X-axis direction while the other is displaced in the negative X-axis direction, and then the one is displaced in the negative X-axis direction while the other is displaced in the positive X-axis direction, i.e., a main mode). Due to this, the coupling of the in-phase flexural vibration mode and the opposite-phase flexural vibration mode can be suppressed to reduce the mixing of the vibration form of the in-phase flexural vibration mode into the vibration form of the opposite-phase flexural vibration mode, so that vibration leakage can be reduced.

The resonator element 100 includes the weight portion 24 connected to the arm portion 22. Therefore, since the width (length in the X-axis direction) of the arm portion 22 can be widened without increasing the resonance frequency of the opposite-phase flexural vibration mode, the path of heat conduction occurring due to flexural deformation during flexural vibration can be lengthened in the width direction in the arm portion 22. Therefore, in the resonator element 100, the thermoelastic loss can be reduced in the heat insulating area.

In the resonator element 100, the groove portions 23 are provided in the vibrating arms 20a and 20b. Therefore, since the path of heat generated by flexural vibration is narrowed in the resonator element 100, it is possible to suppress the diffusion of the heat (heat conduction). Due to this, in the resonator element 100, the thermoelastic loss can be reduced in the heat insulating area.

1.2. Method for Manufacturing Resonator Element

Figure 4:
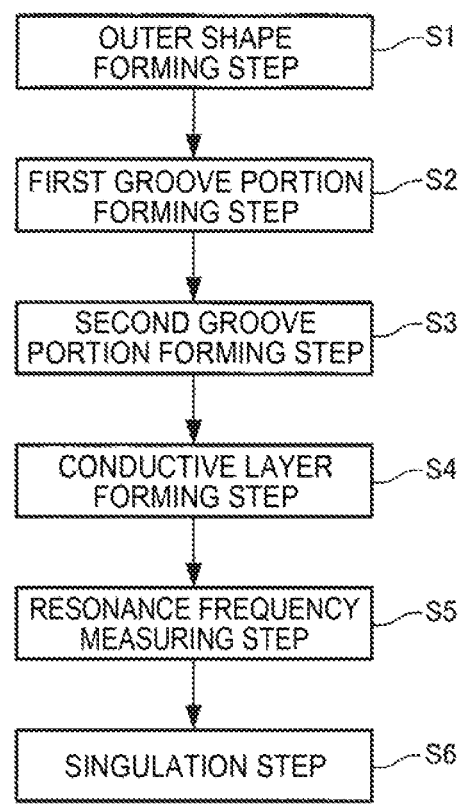
FIG. 4 is a flowchart for explaining a method for manufacturing the resonator element according to the first embodiment.
Figure 5:
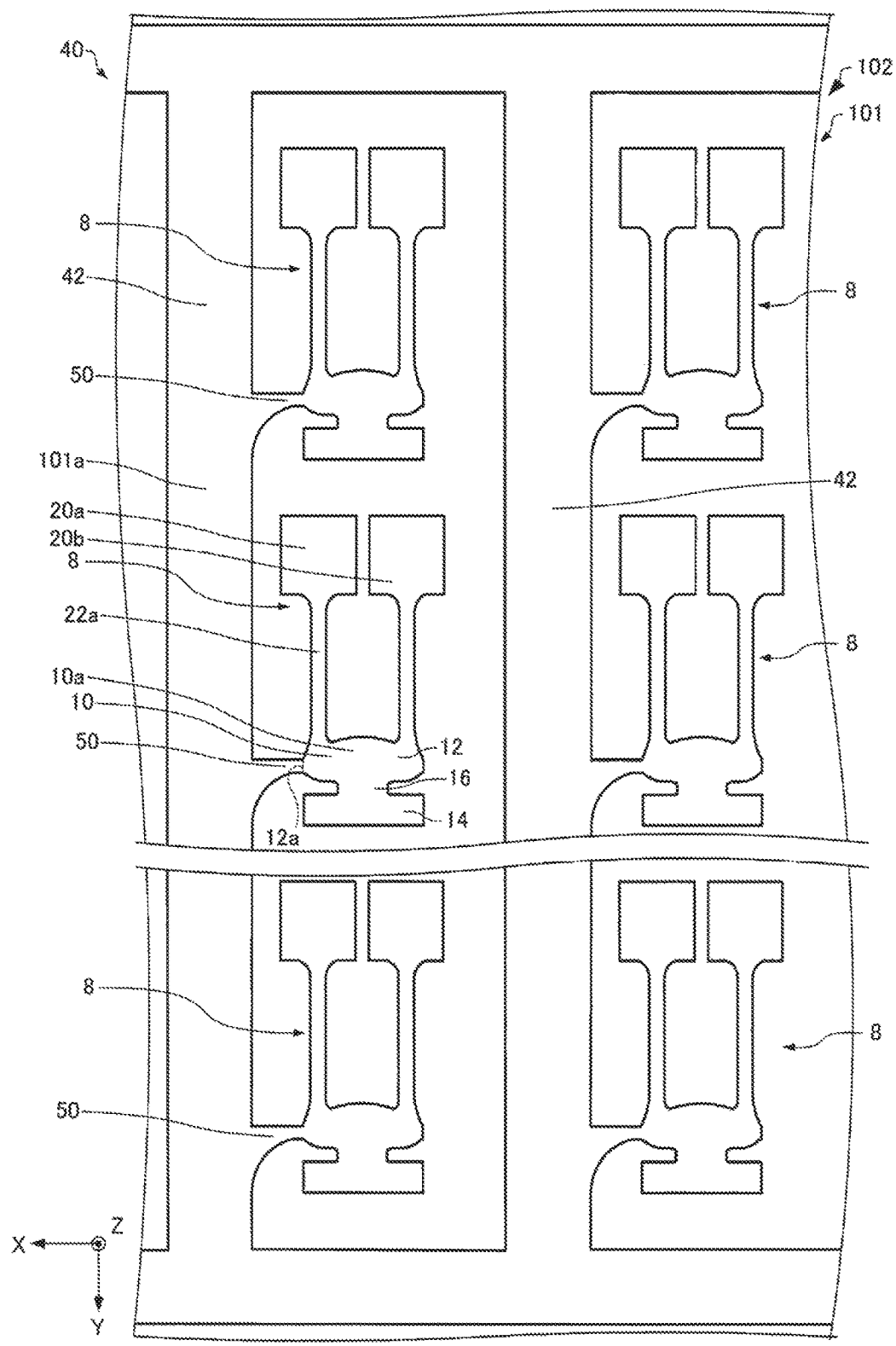
FIG. 5 is a plan view schematically showing a manufacturing step of the resonator element according to the first embodiment.
Figure 6:
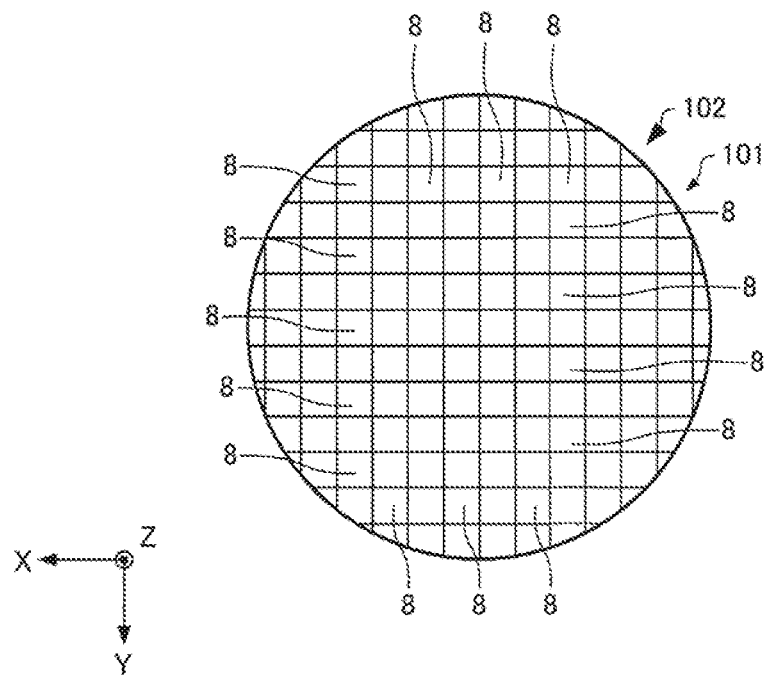
FIG. 6 is a plan view schematically showing a manufacturing step of the resonator element according to the first embodiment.
Figure 7:
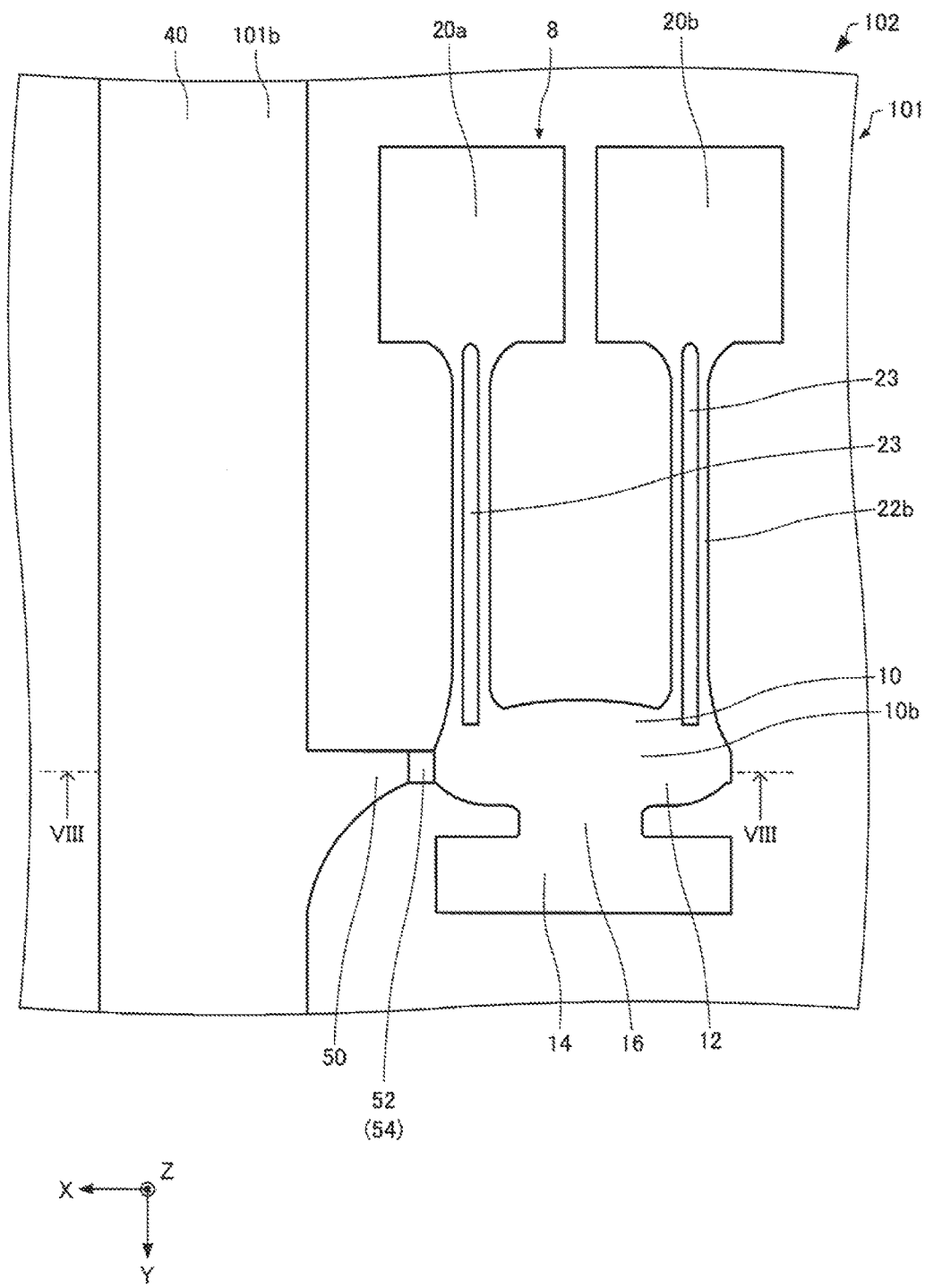
FIG. 7 is a plan view schematically showing a manufacturing step of the resonator element according to the first embodiment.
Figure 8:
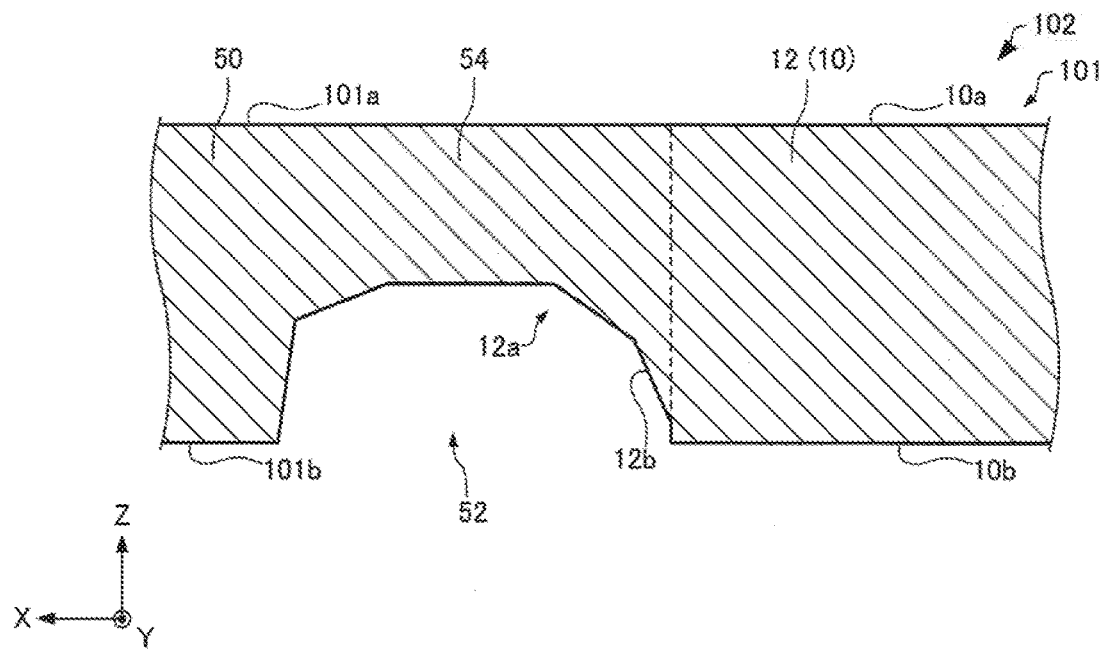
FIG. 8 is a cross-sectional view schematically showing a manufacturing step of the resonator element according to the first embodiment.
Figure 9:
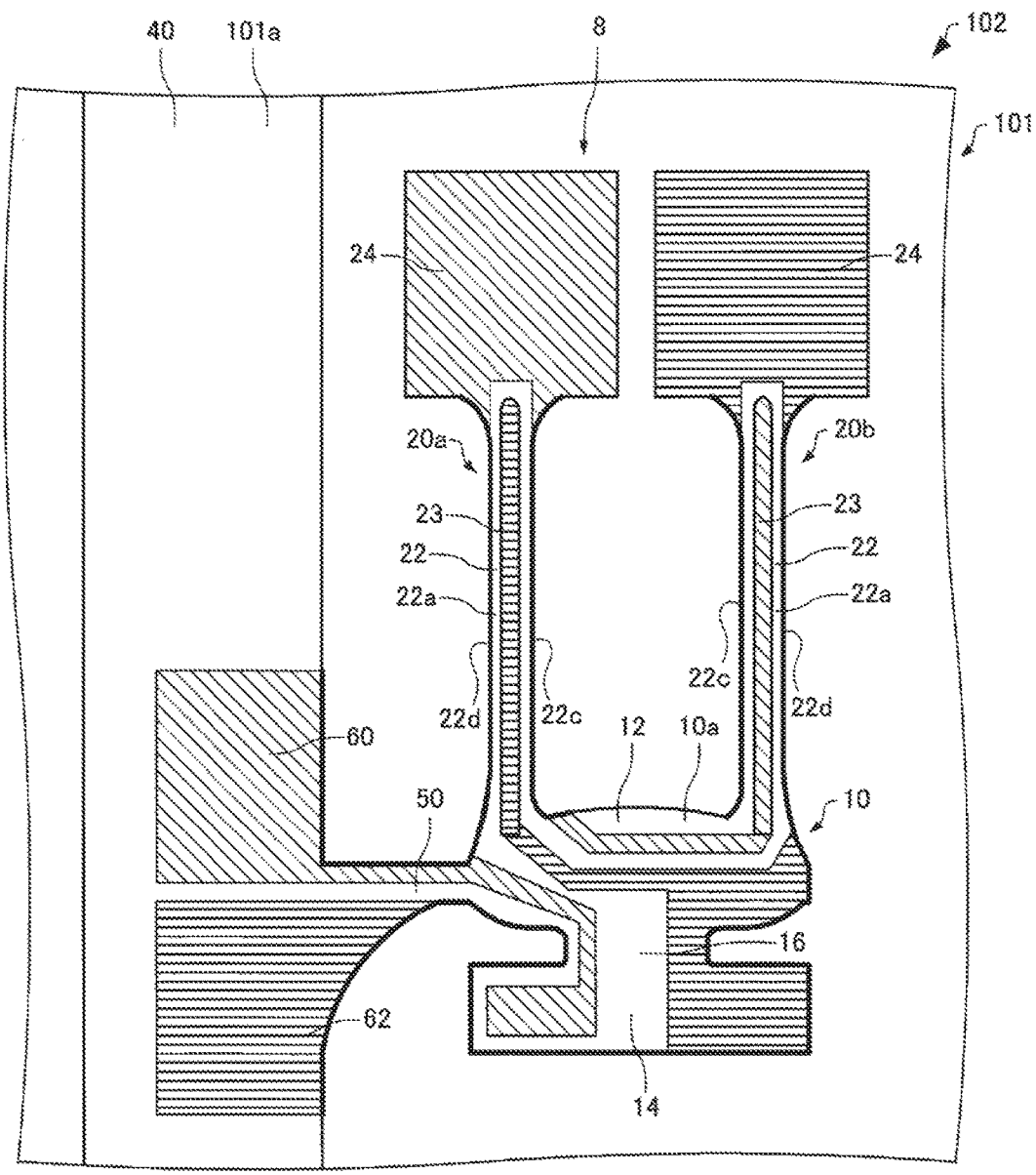
FIG. 9 is a plan view schematically showing a manufacturing step of the resonator element according to the first embodiment.
Figure 10:
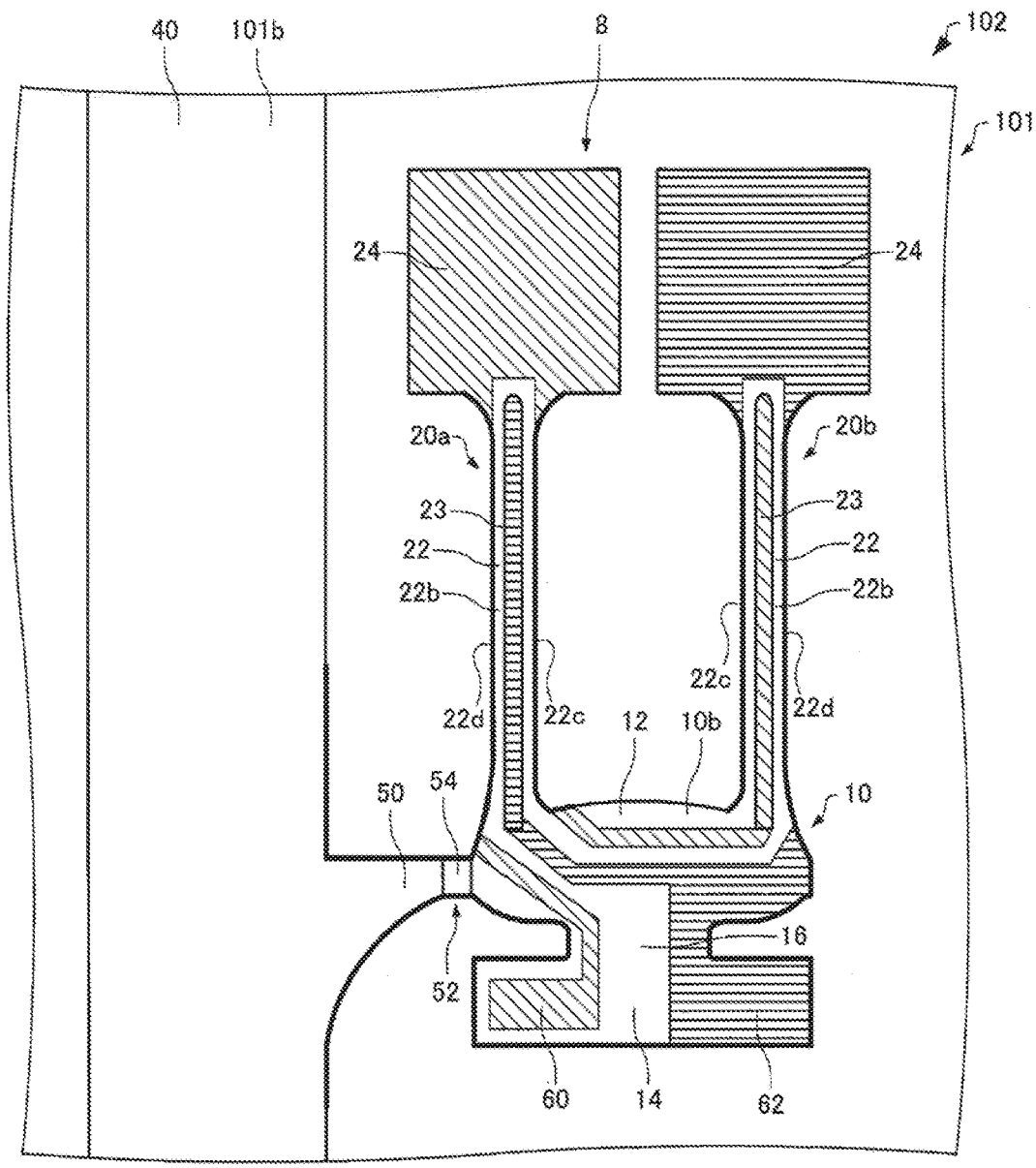
FIG. 10 is a plan view schematically showing a manufacturing step of the resonator element according to the first embodiment.

Next, a method for manufacturing the resonator element 100 according to the first embodiment will be described with reference to the drawings. FIG. 4 is a flowchart for explaining the method for manufacturing the resonator element 100 according to the first embodiment. FIGS. 5 to 7 are plan views schematically showing manufacturing steps of the resonator element 100 according to the first embodiment. FIG. 8 is a cross-sectional view schematically showing a manufacturing step of the resonator element 100 according to the first embodiment, taken along the line VIII-VIII of FIG. 7. FIGS. 9 and 10 are plan views schematically showing manufacturing steps of the resonator element 100 according to the first embodiment.

First, as shown in FIG. 5, a quartz crystal substrate 101 is etched to form, in the plan view, the base portion 10, the vibrating arms 20a and 20b, a frame portion 40 provided so as to surround the base portion 10 and the vibrating arms 20a and 20b, and a coupling portion 50 that couples the base portion 10 with the frame portion 40 (an outer shape forming step S1). With this step, a wafer 102 including the base portion 10, the vibrating arms 20a and 20b, the frame portion 40, and the coupling portion 50 can be formed. In the wafer 102, as shown in FIGS. 5 and 6, a plurality of structures 8 each including the base portion 10, the vibrating arms 20a and 20b, and the coupling portion 50 are provided. FIG. 5 is an enlarged view of FIG. 6. In the example shown in FIG. 6, the shape of the wafer 102 is circular, but the shape is not particularly limited and may be, for example, rectangular. In FIG. 6, the structure 8 is illustrated in a simplified manner with the frame portion 40 being omitted, for convenience sake.

In the outer shape forming step S1, the coupling portion 50 is formed so as to extend to the frame portion 40 from only one of the two side surfaces of the base portion 10, which cross (specifically, orthogonal to) the X-axis direction in the plan view and are in opposing relationship to each other. In the example shown in FIG. 5, the coupling portion 50 extends to the frame portion 40 from the side surface 12a of the first base portion 12. The coupling portion 50 extends from the side surface 12a in the positive X-axis direction. In the example shown in FIG. 5, the frame portion 40 includes extending portions 42 extending in the Y-axis direction. The coupling portion 50 couples the extending portion 42 with the base portion 10. Although not illustrated, the frame portion 40 may include extending portions extending in the X-axis direction, and the coupling portion 50 may couple the extending portion with the base portion 10.

In the outer shape forming step S1, a predetermined shaped resist layer (not shown) is formed on both major surfaces 101a and 101b (major surfaces in opposing relationship to each other) of the quartz crystal substrate 101 orthogonal to the Z-axis, and wet etching is performed using the resist layer as a mask from both sides of the major surfaces 101a and 101b, whereby the wafer 102 including the structure 8 and the frame portion 40 is formed. The wafer 102 is a wafer for manufacturing the resonator element 100. FIG. 5 is a diagram of the structure 8 viewed from the major surface 101a side, for explaining a configuration of the structure 8 on the major surface 101a side.

Next, as shown in FIG. 7, a first groove portion 52 extending along the Y-axis direction is formed in the coupling portion 50 (a first groove portion forming step S2). FIG. 7 is a diagram of the structure 8 viewed in a see-through manner from the major surface 101a side, for explaining a configuration of the structure 8 on the major surface 101b side. The first groove portion 52 is provided from a side surface (edge) of the coupling portion 50 on the positive Y-axis direction side over a side surface (edge) thereof on the negative Y-axis direction side, but is not limited to this. The first groove portion 52 may be formed partially as long as the first groove portion 52 is located between the side surface (edge) of the coupling portion 50 on the positive Y-axis direction side and the side surface (edge) on the negative Y-axis direction side, and a single or plurality of first groove portions 52 may be formed therebetween. Moreover, although the first groove portion 52 is provided in the major surface 101b of the quartz crystal substrate 101, the first groove portion 52 may be provided also in the major surface 101a of the quartz crystal substrate 101. The major surface 101b of the quartz crystal substrate 101 is a surface configured to include the major surface 10b of the base portion 10.

As shown in FIG. 8, the coupling portion 50 includes a thinned portion 54 formed due to the first groove portion 52. The thinned portion 54 has a thickness smaller than the thickness of the base portion 10. In the plan view as shown in FIG. 7, the thinned portion 54 is provided adjacent to the base portion 10. The inner surface 12a of the first groove portion 52 is inclined to the major surfaces 10a and 10b of the base portion 10. In the illustrated example, the inner surface 12a is the side surface of the first base portion 12 on the positive X-axis direction side.

In the first groove portion forming step S2, a predetermined shaped resist layer is formed on the major surfaces 101a and 101b of the quartz crystal substrate 101, and the coupling portion 50 is wet-etched from the major surface 101b side using the resist layer (not shown) as a mask, whereby the first groove portion 52 can be formed.

The length of the thinned portion 54 of the coupling portion 50 along the X-axis direction is, for example, 1 μm or more and 100 μm or less, preferably 5 μm or more and 50 μm or less, and more preferably 10 μm or more and 20 μm or less. When the length of the thinned portion 54 along the X-axis direction is smaller than 1 μm, it may be difficult to form the first groove portion 52 by wet etching. When the length of the thinned portion 54 along the X-axis direction is greater than 100μm, the number of structures 8 that can be formed in the wafer may be reduced.

The thickness of the thinned portion 54 of the coupling portion 50 is, for example, 10% or more and 70% or less, preferably 30% or more and 60% or less, and more preferably 40% or more and 55% or less of the thickness of the base portion 10. When the thickness of the thinned portion 54 is smaller than 10% of the thickness of the base portion 10, the structure 8 may drop (it is impossible to keep the structure 8 connected to the frame portion 40 via the coupling portion 50) in wet-etching the quartz crystal substrate 101. When the thickness of the thinned portion 54 is greater than 70% of the thickness of the base portion 10, the coupling portion 50 may not be easily cut in a singulation step S6 described later.

Next, as shown in FIG. 7, the second groove portion extending along the Y-axis direction is formed in the vibrating arms 20a and 20b (a second groove portion forming step S3). The second groove portion 23 is formed in the major surfaces 22a and 22b of the vibrating arms 20a and 20b. In the second groove portion forming step S3, a predetermined shaped resist layer is formed on the major surfaces 101a and 101b of the quartz crystal substrate 101, and the vibrating arms 20a and 20b are wet-etched from the sides of the major surfaces 101a and 101b using the resist layer (not shown) as a mask, whereby the second groove portion 23 is formed.

The order of the first groove portion forming step S2 and the second groove portion forming step S3 is not limited. Moreover, the first groove portion forming step S2 and the second groove portion forming step S3 may be performed in the same step. That is, the first groove portion 52 provided in the major surface 101b, the second groove portion 23 provided in the major surface 101a, and the second groove portion 23 provided in the major surface 101b may be simultaneously formed. Due to this, shortening of the steps can be achieved.

Next, as shown in FIGS. 9 and 10, conductive layers 60 and 62 are formed on the quartz crystal substrate 101 (a conductive layer forming step S4). The first conductive layer 60 is formed on the frame portion 40, the coupling portion 50, the base portion 10, the side surfaces 22c and 22d of the arm portion 22 of the first vibrating arm 20a, the weight portion 24 of the first vibrating arm 20a, and an inner surface of the second groove portion 23 provided in the second vibrating arm 20b. The second conductive layer 62 is formed on the frame portion 40, the coupling portion 50, the base portion 10, the side surfaces 22c and 22d of the arm portion 22 of the second vibrating arm 20b, the weight portion 24 of the second vibrating arm 20b, and an inner surface of the second groove portion 23 provided in the first vibrating arm 20a. This step is performed such that the conductive layers 60 and 62 are not formed partially on the inner surface of the first groove portion 52 or the entire inner surface thereof so that contact between the conductive layers 60 and 62 formed on the side surface (edge face) of the coupling portion 50 on the positive Y-axis direction side and the side surface (edge face) on the negative Y-axis direction side is prevented (an electrical short circuit is not caused in a resonance frequency measuring step S5 described later).

FIG. 9 is a diagram of the structure 8 viewed from the major surface 101a side, for explaining a configuration of the structure 8 on the major surface 101a side. FIG. 10 is a diagram of the structure 8 viewed in a see-through manner from the major surface 101a side, for explaining a configuration of the structure 8 on the major surface 101b side. Moreover, in FIGS. 9 and 10, and FIGS. 11, 12, and 20 to 23 shown below, the first conductive layer 60 is shown by diagonal lines, and the second conductive layer 62 is shown by horizontal lines. Moreover, in FIGS. 9 and 10, and FIGS. 11, 12, and 20 to 23 shown below, the conductive layers 60 and 62 provided on side surfaces of the quartz crystal substrate 101 are shown by heavy lines.

The first conductive layer 60 provided on the first vibrating arm 20a and the second vibrating arm 20b is one of the drive electrodes. The second conductive layer 62 provided on the first vibrating arm 20a and the second vibrating arm 20b is the other drive electrode. The first conductive layer 60 provided on the major surface 10b of the second base portion 14 is bonded with the first conductive bonding member 18a (see FIG. 1). The second conductive layer 62 provided on the major surface 10b of the second base portion 14 is bonded with the second conductive bonding member 18b (see FIG. 1).

In the conductive layer forming step S4, for example, a metal layer (not shown) is formed by a sputtering method or the like, and the metal layer is pattered by photolithography and etching, whereby the conductive layers 60 and 62 are formed.

Figure 11:
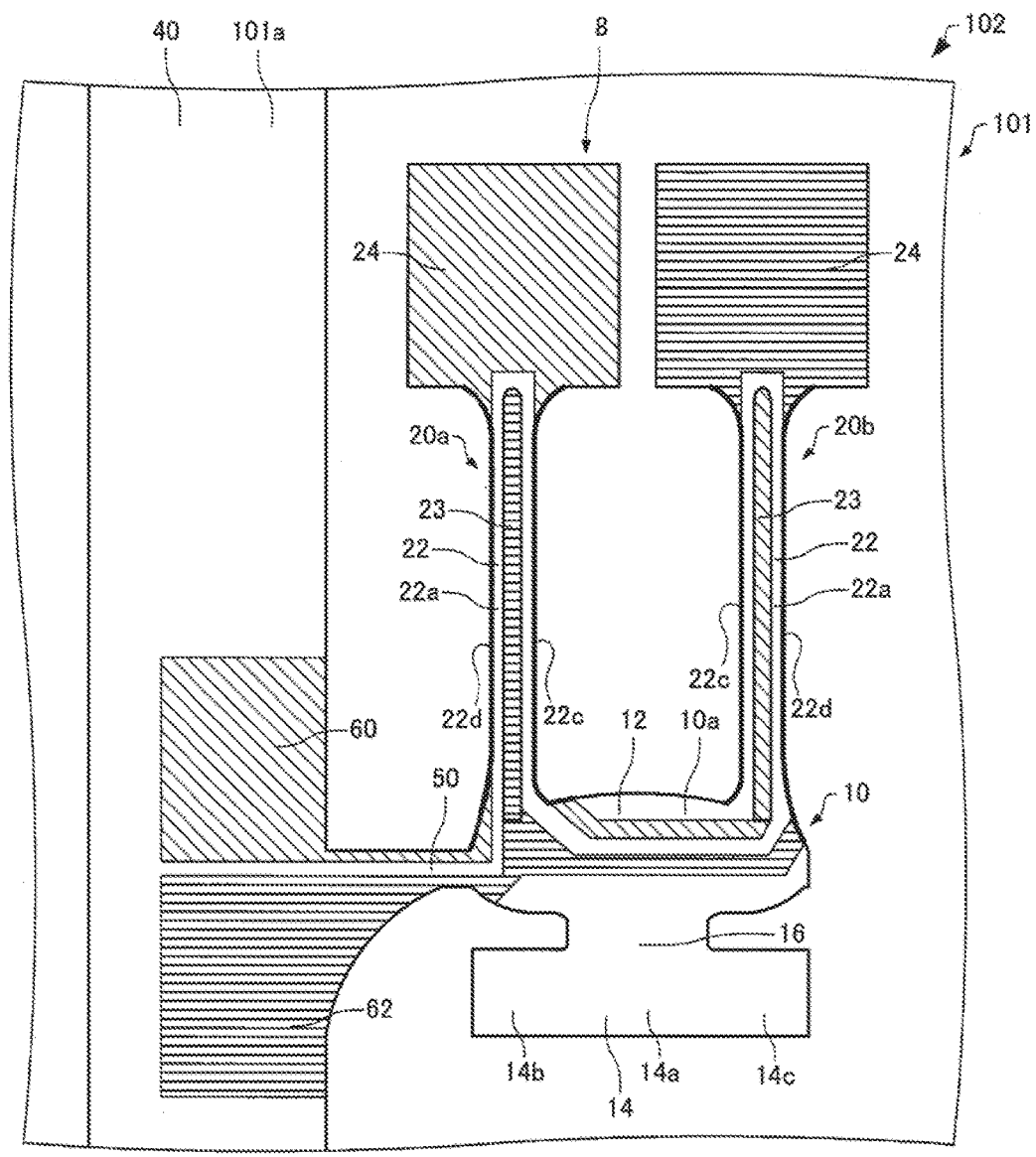
FIG. 11 is a plan view schematically showing a manufacturing step of the resonator element according to the first embodiment.
Figure 11:
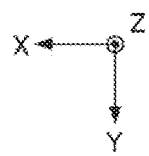
Figure 12:
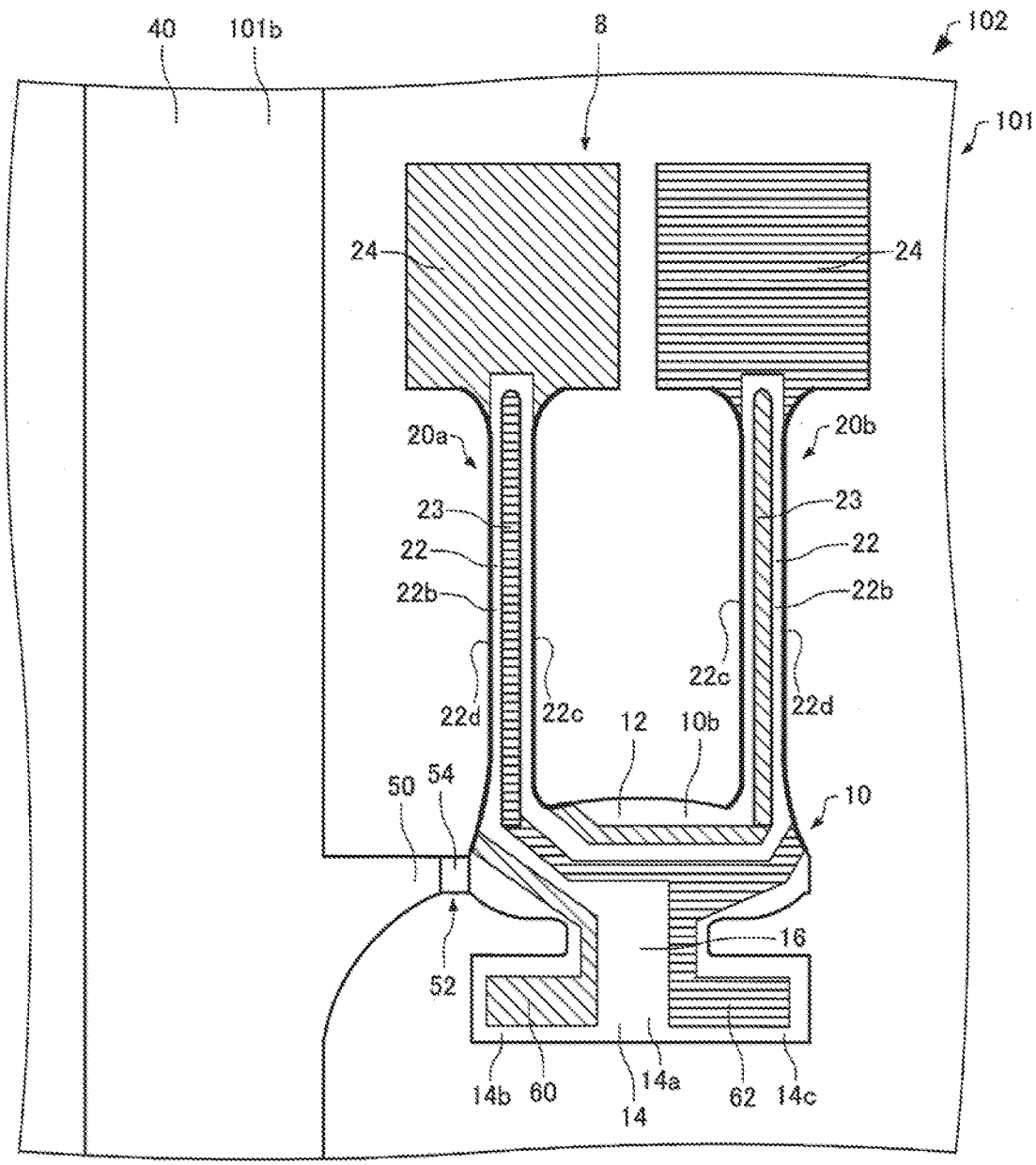
FIG. 12 is a plan view schematically showing a manufacturing step of the resonator element according to the first embodiment.
Figure 12:
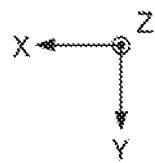

Although, in the example shown in FIGS. 9 and 10, the conductive layers 60 and 62 are provided on the side surfaces of the second base portion 14, the conductive layers 60 and 62 may be provided so as to avoid the side surfaces of the second base portion 14 as shown in FIGS. 11 and 12. Due to this, when the structure 8 is singulated and mounted on the package, it is possible to suppress contact between the first conductive bonding member 18a and the second conductive layer 62 provided on the side surface of the second base portion 14. Similarly, it is possible to suppress contact between the second conductive bonding member 18b and the first conductive layer 60 provided on the side surface of the second base portion 14. Hence, an electrical short circuit can be suppressed. The resist layer provided on the side surface of the second base portion 14 can be exposed by performing photolithography using, for example, inclined exposure (exposure that is performed by emitting light in a direction inclined to the Z-axis), and as a result, it is possible to prevent the conductive layers 60 and 62 from remaining on the side surfaces of the second base portion 14.

Further, in the example shown in FIGS. 11 and 12, the conductive layers 60 and 62 are not provided on the side surfaces of the coupling portion 50 by the use of a means such as the inclined exposure described above. Therefore, even when the conductive layer remains on the inner surface of the first groove portion 52, an electrical short circuit can be reduced in the resonance frequency measuring step S5 described later.

Moreover, by the use of a means such as the inclined exposure described above, the side surface of the second portion 14b of the second base portion 14 has a portion where the conductive layers 60 and 62 are not provided (the entire side surface in FIGS. 11 and 12). Therefore, when the second portion 14b of the second base portion 14 is fixed to the package via the first bonding member 18a, even if the first bonding member 18a is formed so as to turn around the side surface of the second portion 14b, an electrical short circuit between the conductive layer 60 and the conductive layer 62 can be reduced in the resonance frequency measuring step S5 described later.

FIG. 11 is a diagram of the structure 8 viewed from the major surface 101a side, for explaining a configuration of the structure 8 on the major surface 101a side. FIG. 12 is a diagram of the structure 8 viewed in a see-through manner from the major surface 101a side, for explaining a configuration of the structure 8 on the major surface 101b side.

Next, the resonance frequency of the structure 8 is measured (the resonance frequency measuring step S5). Specifically, a probe is brought to contact the conductive layers 60 and 62 provided on the frame portion 40; an electric signal (alternating voltage) is applied to the drive electrodes of the resonator element 100 to generate an electric field; the flexural vibration in which the vibrating arms 20a and 20b are displaced with the root portion thereof as a supporting point so as to bend alternately in the directions of the arrows A (directions in which the vibrating arms 20a and 20b are away from each other) and in the directions of the arrows B (directions in which the vibrating arms 20a and 20b approach each other) shown in FIG. 1 (the vibrating arms 20a and 20b vibrate in the opposite-phase mode in the X-axis direction) is caused to occur with the piezoelectric effect and inverse piezoelectric effect of quartz crystal; and the resonance frequency of the structure 8 is measured.

Next, the coupling portion 50 is cut to singulate (break off) the structure 8 (the resonator element 100) (the singulation step S6). In doing so, a portion of the coupling portion 50 is connected as the break-off mark 30 to the base portion 10. The method for cutting the coupling portion 50 is not particularly limited, and, for example, the coupling portion 50 is cut by pushing the base portion 10 of the structure 8 from the major surface 10b side.

Through the steps described above, the resonator element 100 can be manufactured.

The method for manufacturing the resonator element 100 has, for example, the following features.

In the method for manufacturing the resonator element 100, the coupling portion 50 is formed so as to extend to the frame portion 40 from only the side surface 12a of the base portion 10 crossing the X-axis direction in the plan view. Therefore, it is possible in the wafer 102 to suppress a reduction in the difference between a resonance frequency F0 (the resonance frequency of the X-axis-direction opposite-phase flexural vibration mode as a main mode) and a resonance frequency F1 (the resonance frequency of the X-axis-direction in-phase flexural vibration mode as a spurious mode). Due to this, the coupling of the main mode and the spurious mode can be suppressed, and thus the resonance frequency F0 can be precisely measured in the state of the wafer 102. Hence, it is possible to reduce the difference between the resonance frequency measured in the state of the wafer 102 and the resonance frequency measured in a singulated state after break-off, and thus quality determination can be made with high accuracy in the state of the wafer 102. As a result, in the method for manufacturing the resonator element 100, the resonator element 100 can be manufactured with good yield.

For example, when the coupling portion extends from both sides of the base portion (from two side surfaces crossing the X-axis direction), the fixing condition of the base portion is greatly different from that in the singulated state after break-off. Therefore, a great difference may occur between the resonance frequency measured in the wafer state and the resonance frequency measured in the singulated state.

Further, in the case where the coupling portion 50 is formed so as to extend to the frame portion from both side surfaces of the base portion 10, which cross the X-axis direction and are in opposing relationship, when, for example, the coupling portion is cut by pushing the base portion 10 of the structure 8 from the major surface 10b side, the cut position may not be stable because of the twisting of the coupling portion 50. Therefore, the break-off mark 30 is largely left to increase the size of the resonator element 100 in the X-axis direction, or, in turn, the base portion 10 is damaged to degrade vibration characteristics, which may lower the yield. In contrast, in the method for manufacturing the resonator element 100 in the invention, the coupling portion 50 is formed so as to extend to the frame portion 40 from only one of the side surfaces of the base portion 10 crossing the X-axis direction. Therefore, the coupling portion 50 is bent in the thickness direction and thus cut, so that the instability of the cut position can be reduced. The instability can be further reduced by providing the thinned portion 54.

Further, in the method for manufacturing the resonator element 100, since the coupling portion 50 is formed so as to extend to the frame portion 40 from only one of the side surfaces of the base portion 10 crossing the X-axis direction, even when the length of the base portion 10 along the Y-axis direction is reduced, the stress occurring in the surface of the base portion 10 on the side of the vibrating arms 20a and 20b can be reduced in cutting the coupling portion 50. Hence, the resonator element 100 of small size can be manufactured.

In the method for manufacturing the resonator element 100 as described above, the resonator element 100 of small size can be manufactured with good yield.

In the method for manufacturing the resonator element 100, the first groove portion 52 is formed in the coupling portion 50. Due to this, the thinned portion 54 can be formed in the coupling portion 50, and thus the coupling portion 50 can be easily cut in the singulation step S6.

In the method for manufacturing the resonator element 100, the inner surface 12a of the first groove portion 52 is inclined to the major surfaces 10a and 10b of the base portion 10. Therefore, the resist layer on the metal layer (metal layer serving as the conductive layers 60 and 62) formed on the inner surface 12a can be easily exposed in photolithography even without especially using inclined exposure. This is because, when exposure light is incident on the wafer 102 from the negative Z-axis direction side to the positive Z-axis direction in FIG. 8 for example, the surface parallel to the major surface is of course exposed, and besides, the inner surface 12a inclined to the major surface is also exposed. Due to this, the metal layer formed on the inner surface 12a can be removed by etching, and thus it is possible to suppress an electrical short circuit between the conductive layers 60 and 62 on the inner surface 12a. For example, when the inner surface of the first groove portion is vertical to the major surface of the base portion, the resist layer on the metal layer formed on the inner surface cannot be exposed, so that the conductive layers 60 and 62 may be electrically short-circuited.

When the inner surface 12a inclined to the major surface is formed at the inner surface of the first groove portion 52, even if the inner surface partially includes a surface vertical to the major surface or a surface nearly vertical thereto, the surface vertical to the major surface 10b may also be exposed depending on the place of the surface by reflection of the light to which the inclined inner surface 12a is exposed. Therefore, it may be possible to reduce an electrical short circuit between the conductive layers 60 and 62.

In the method for manufacturing the resonator element 100, the inner surface 12a of the first groove portion 52 is a surface on the positive X-axis direction side of the X-axis as an electrical axis that is a crystal axis of quartz crystal. Therefore, the inner surface 12a can be inclined to the major surfaces 10a and 10b of the base portion 10 by wet etching.

In the wafer 102, the coupling portion 50 extends to the frame portion 40 from only one of the side surfaces of the base portion 10 crossing the X-axis direction. Therefore, as described above, quality determination can be made with high accuracy on the wafer 102, and the resonator element 100 of small size can be manufactured in the wafer 102 with good yield.

1.3. Modified Examples of Resonator Element 1.3.1. First Modified Example

Figure 13:
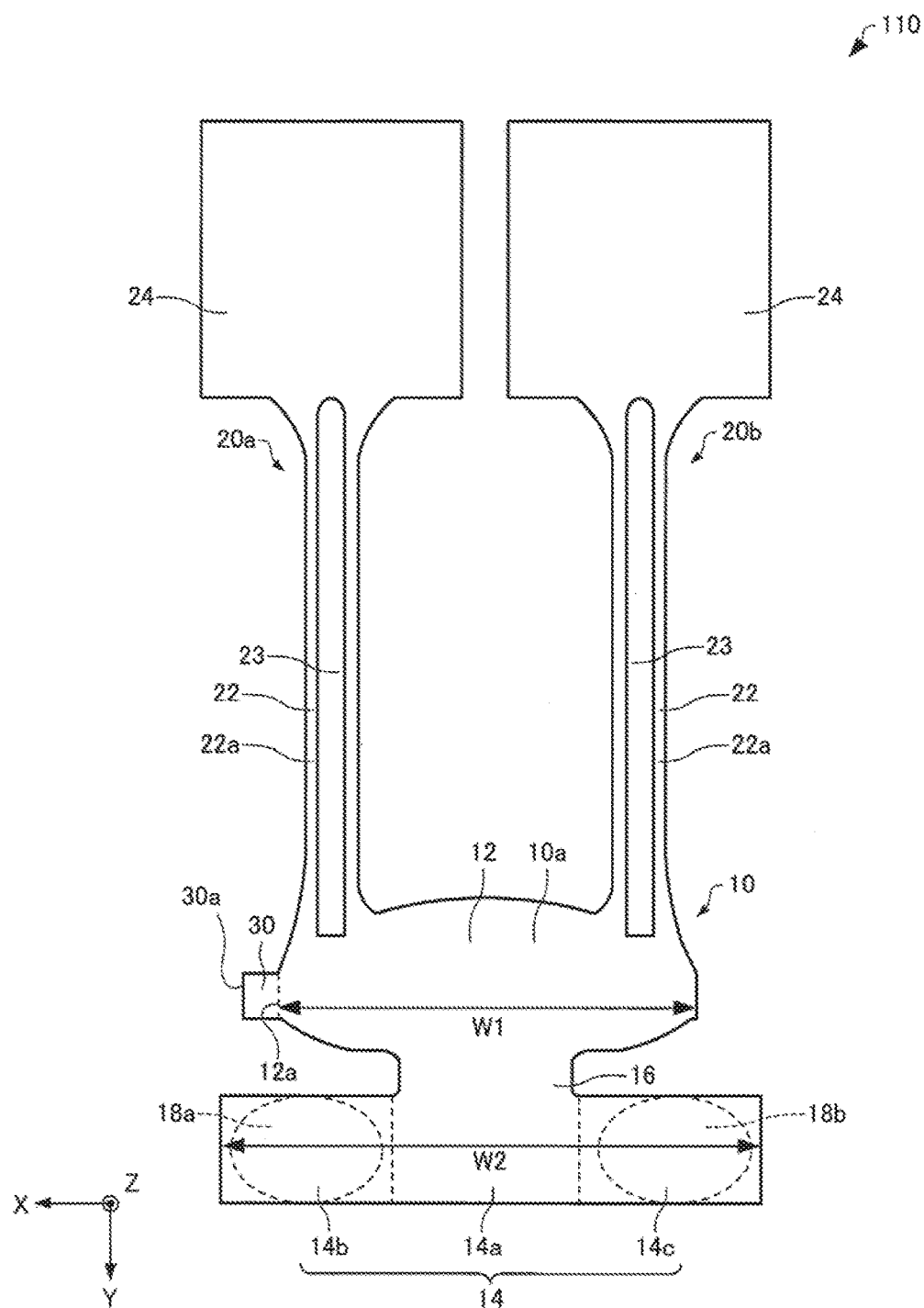
FIG. 13 is a plan view schematically showing a resonator element according to a first modified example of the first embodiment.

Next, a resonator element according to a first modified example of the first embodiment will be described with reference to the drawing. FIG. 13 is a plan view schematically showing the resonator element 110 according to the first modified example of the first embodiment.

Hereinafter, in the resonator element 110 according to the first modified example of the first embodiment, members having functions similar to the constituent members of the resonator element 100 according to the first embodiment are denoted by the same reference numerals and signs, and a detailed description of the members is omitted. The same applies to resonator elements according to second, third, and fourth modified examples of the first embodiment shown below.

In the resonator element 100 described above, as shown in FIG. 1, the width W2 of the second base portion 14 along the X-axis direction is equal to or less than the width W1 of the first base portion 12 along the X-axis direction.

In contrast, in the resonator element 110 as shown in FIG. 13, the width W2 is greater than the width W1. Specifically, in the resonator element 110, the width of the second portion 14b and the third portion 14c of the second base portion 14 along the X-axis direction can be increased compared with the resonator element 100.

In the resonator element 110, since the width W2 is greater than the width W1, the contact area between the conductive bonding members 18a and 18b and the resonator element 110 can be increased. Therefore, the resonator element 110 can be stably mounted on the package. Although not illustrated, the contact area can be further increased by providing at least one through-hole, bottomed hole or groove, or notch in a surface, and in the vicinity thereof, of at least one of the second portion 14b and the third portion 14c of the second base portion 14 to be bonded with a conductive bonding member, and then forming the conductive bonding member. Thus, the resonator element 110 can be further stably mounted on the package (the same applies to other embodiments).

1.3.2. Second Modified Example

Figure 14:
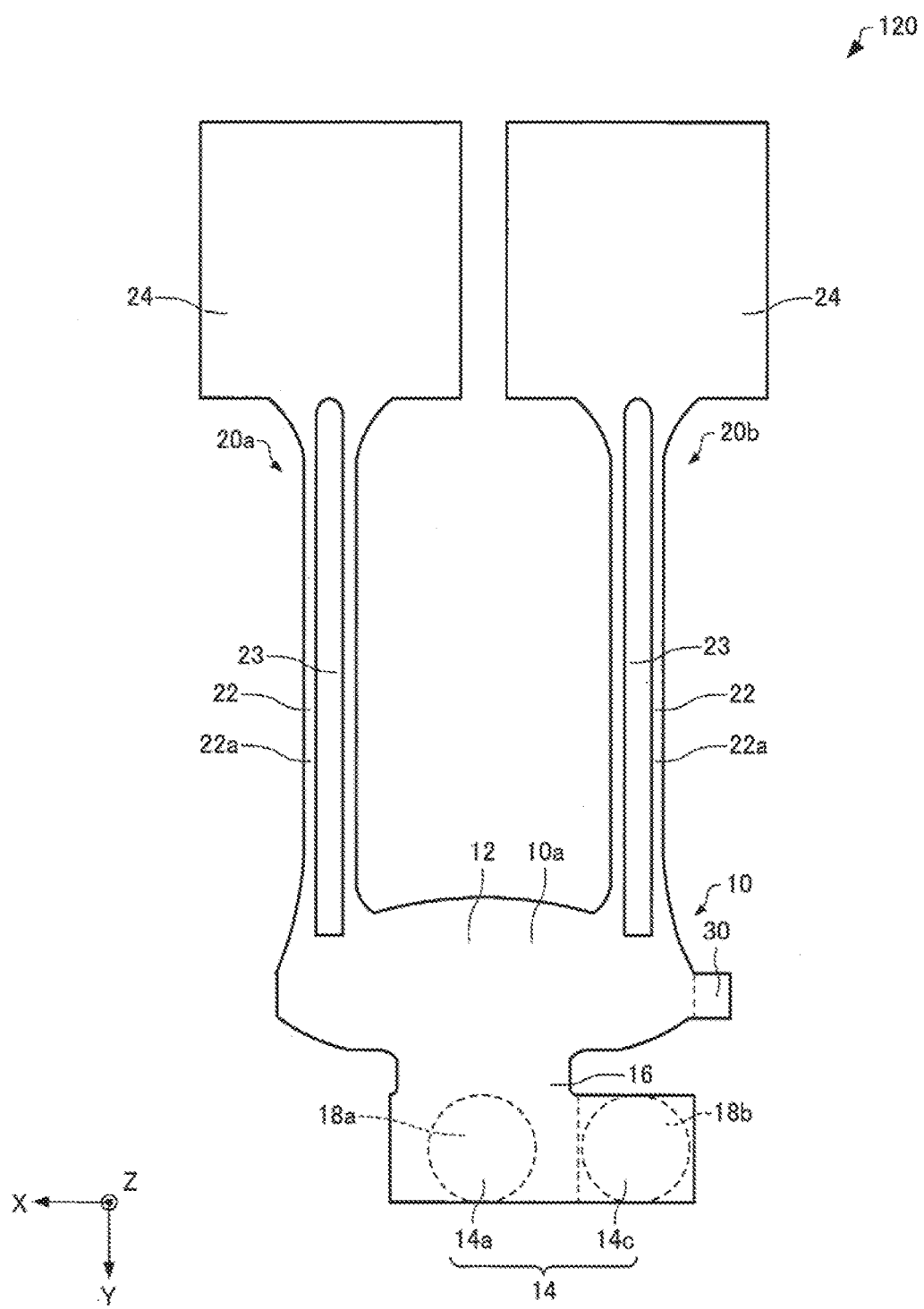
FIG. 14 is a plan view schematically showing a resonator element according to a second modified example of the first embodiment.

Next, a resonator element according to a second modified example of the first embodiment will be described with reference to the drawing. FIG. 14 is a plan view schematically showing the resonator element 120 according to the second modified example of the first embodiment.

In the resonator element 100 described above, as shown in FIG. 1, the second base portion 14 includes the first portion 14a, the second portion 14b, and the third portion 14c, the second portion 14b is fixed to the package via the first conductive bonding member 18a, and the second portion 14b is fixed to the package via the second conductive bonding member 18b.

In contrast, in the resonator element 120 as shown in FIG. 14, the second base portion 14 does not include the second portion 14b. In the resonator element 120, the first portion 14a is fixed to the package via the first conductive bonding member 18a, and the third portion 14c is fixed to the package via the second conductive bonding member 18b. Further, in the illustrated example, the break-off mark 30 is provided on a side surface of the first base portion 12 orthogonal to the X-axis direction, which is a surface of the first base portion 12 on the negative X-axis direction side.

In the resonator element 120, the second base portion 14 does not include the second portion 14b, the first portion 14a is fixed to the package via the first conductive bonding member 18a, and the third portion 14c is fixed to the package via the second conductive bonding member 18b. Hence, in the resonator element 120, a fixing load to the package in the spurious mode (the X-axis-direction in-phase flexural vibration mode) is lessened because two fixed places are close to each other compared with the resonator element 100. Therefore, the resonance frequency of the spurious mode is reduced so as to be away from the resonance frequency of the main mode (the X-axis-direction opposite-phase flexural vibration mode). Due to this, since the coupling of the modes can be reduced, vibration leakage of the resonator element 120 in the main mode can be suppressed.

1.3.3. Third Modified Example

Figure 15:
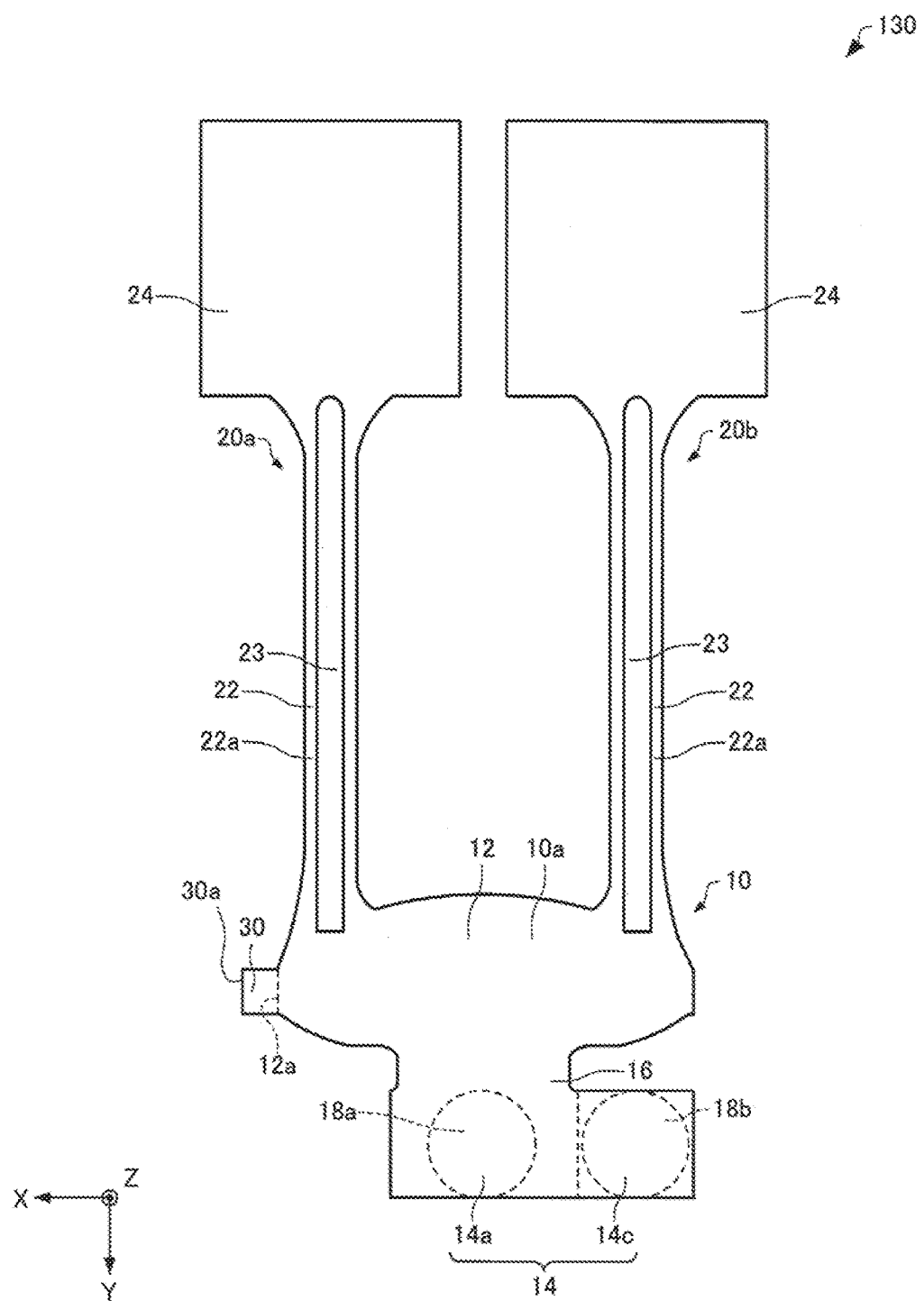
FIG. 15 is a plan view schematically showing a resonator element according to a third modified example of the first embodiment.

Next, a resonator element according to a third modified example of the first embodiment will be described with reference to the drawing. FIG. 15 is a plan view schematically showing the resonator element 130 according to the third modified example of the first embodiment.

In the resonator element 100 described above, as shown in FIG. 1, the second base portion 14 includes the first portion 14a, the second portion 14b, and the third portion 14c, the second portion 14b is fixed to the package via the first conductive bonding member 18a, and the second portion 14b is fixed to the package via the second conductive bonding member 18b.

In contrast, in the resonator element 130 as shown in FIG. 15 (similarly to the resonator element 120), the second base portion 14 does not include the second portion 14b. In the resonator element 130, the first portion 14a is fixed to the package via the first conductive bonding member 18a, and the third portion 14c is fixed to the package via the second conductive bonding member 18b.

In the resonator element 130, the second base portion 14 does not include the second portion 14b, the first portion 14a is fixed to the package via the first conductive bonding member 18a, and the third portion 14c is fixed to the package via the second conductive bonding member 18b. Hence, in the resonator element 130, a fixing load to the package in the spurious mode (the X-axis-direction in-phase flexural vibration mode) is lessened because two fixed places are close to each other compared with the resonator element 100. Therefore, the resonance frequency of the spurious mode is reduced so as to be away from the resonance frequency of the main mode (the X-axis-direction opposite-phase flexural vibration mode). Due to this, vibration leakage can be suppressed in the resonator element 130.

Further, in the resonator element 130, the break-off mark 30 extends from the base portion 10 along the positive X-axis direction, and the second base portion 14 does not include the second portion 14b (see FIG. 1) extending from the first portion 14a along the positive X-axis direction. Therefore, it is possible in the resonator element 130 to reduce the difficulty of forming the shape by wet etching due to the anisotropy of quartz crystal because the second base portion 14 is excessively close to the frame portion 40 or the coupling portion 50 in the state of the wafer 102 (see FIG. 5). That is, the resonator element 130 can be arranged on the wafer more densely than the resonator element 120, and therefore, the number of resonator elements obtained from one wafer can be increased.

1.3.4. Fourth Modified Example

Figure 16:
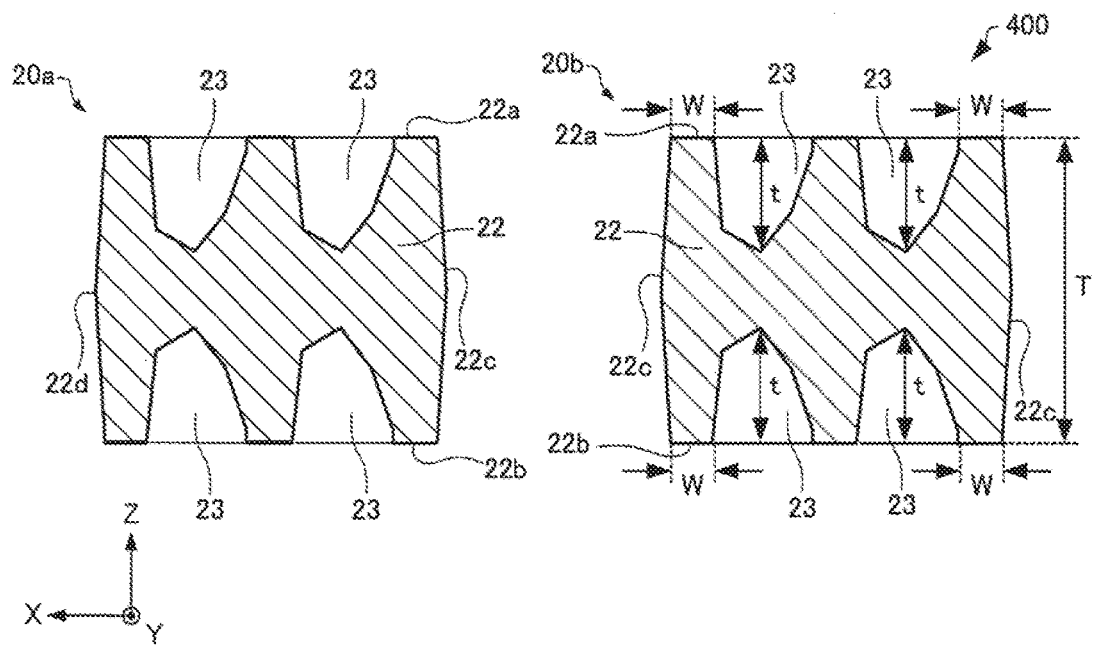
FIG. 16 is a cross-sectional view schematically showing a resonator element according to a fourth modified example of the first embodiment.

Next, a resonator element according to a fourth modified example of the first embodiment will be described with reference to the drawing. FIG. 16 is a cross-sectional view schematically showing the resonator element 140 according to the fourth modified example of the first embodiment. FIG. 16 shows the same cross section as FIG. 2, which schematically shows the resonator element 100.

In the resonator element 100 described above, as shown in FIG. 2, one groove portion 23 is provided in each of the major surfaces 22a and 22b of the vibrating arms 20a and 20b.

In contrast, in the resonator element 140 as shown in FIG. 16, two groove portions 23 are provided in each of the major surfaces 22a and 22b. The two groove portions 23 provided in each of the major surfaces 22a and 22b are provided side by side along the X-axis. Although not illustrated, three or more groove portions 23 may be provided in each of the major surfaces 22a and 22b.

2. Second Embodiment 2. 1. Resonator Element

Next, a resonator element according to a second embodiment will be described with reference to the drawings. FIG.

17 is a plan view schematically showing the resonator element 200 according to the second embodiment. FIG. 18 is a cross-sectional view schematically showing the resonator element 200 according to the second embodiment, taken along the line XVIII-XVIII of FIG. 17.

Hereinafter, in the resonator element 200 according to the second embodiment, members having functions similar to the constituent members of the resonator element 100 according to the first embodiment are denoted by the same reference numerals and signs, and a detailed description of the members is omitted.

In the resonator element 100 described above, as shown in FIG. 1, the break-off mark 30 is provided on the side surface 12a of the first base portion 12 on the positive X-axis direction side.

Figure 17:
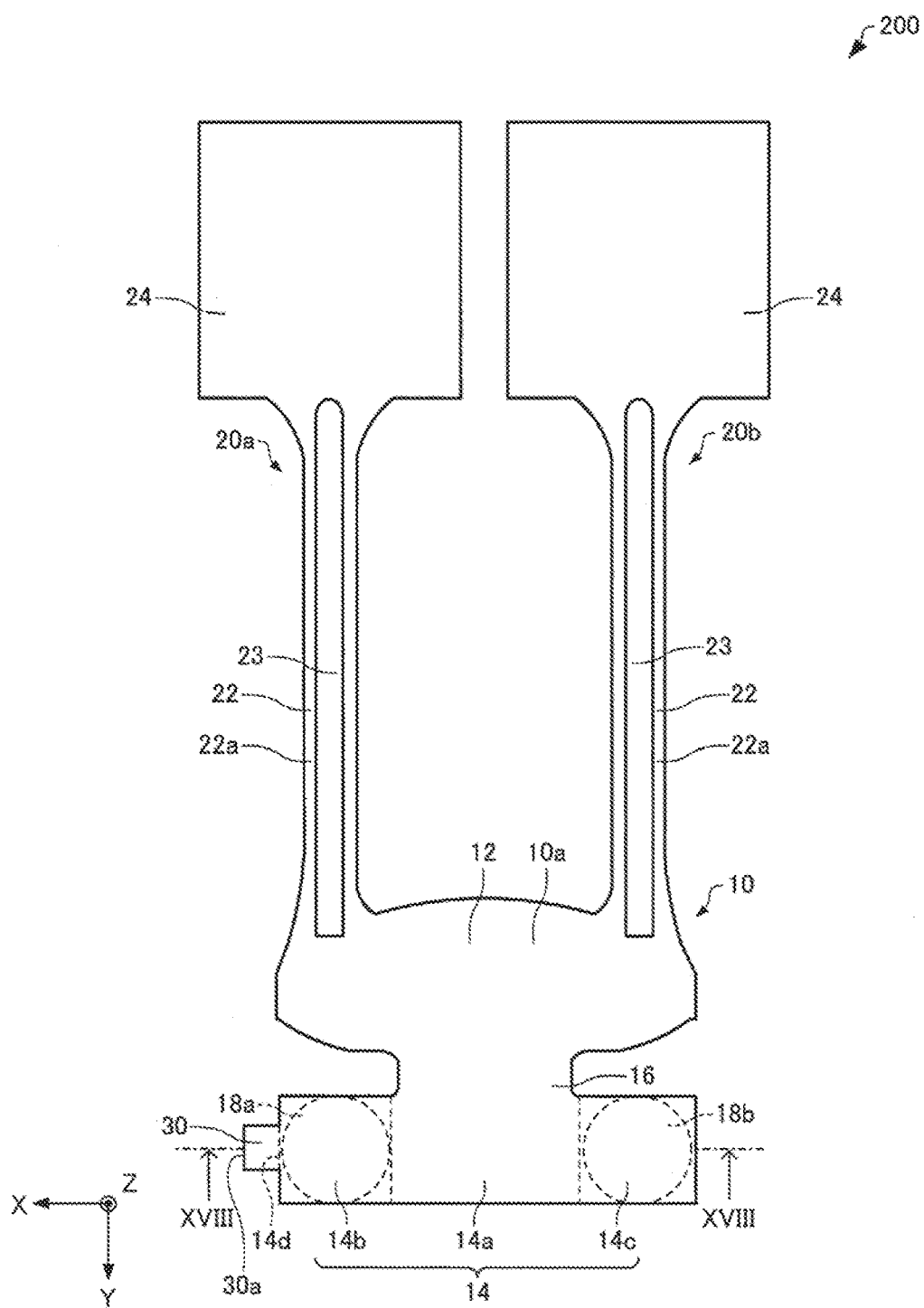
FIG. 17 is a plan view schematically showing a resonator element according to a second embodiment.
Figure 18:
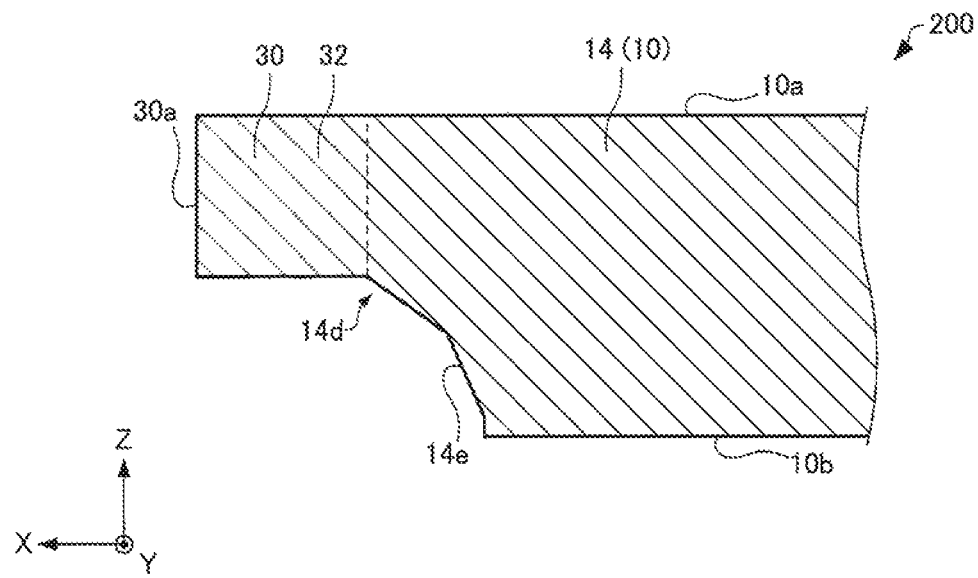
FIG. 18 is a cross-sectional view schematically showing the resonator element according to the second embodiment.

In contrast, in the resonator element 200 as shown in FIG. 17, the break-off mark 30 is provided on a side surface 14d of the second base portion 14 on the positive X-axis direction side. The side surface 14d is a surface of the second base portion 14 on the positive X-axis direction side of the X-axis as an electrical axis that is a crystal axis of quartz crystal. As shown in FIG. 18, the side surface 14d includes an inclined portion 14e inclined to the major surfaces 10a and 10b of the base portion 10.

In the resonator element 200, the break-off mark 30 is provided on the side surface 14d of the second base portion 14. Therefore, in the resonator element 200, the distance between the break-off mark 30 and the first vibrating arm 20a and the distance between the break-off mark 30 and the second vibrating arm 20b can be increased compared with, for example, the resonator element 100. Due to this, in the resonator element 200, the influence of the break-off mark 30 on the vibrations of the vibrating arms 20a and 20b can be reduced, and thus it is possible to suppress the unbalance between the vibration of the first vibrating arm 20a and the vibration of the second vibrating arm 20b due to the break-off mark 30.

2.2. Method for Manufacturing Resonator Element

Figure 19:
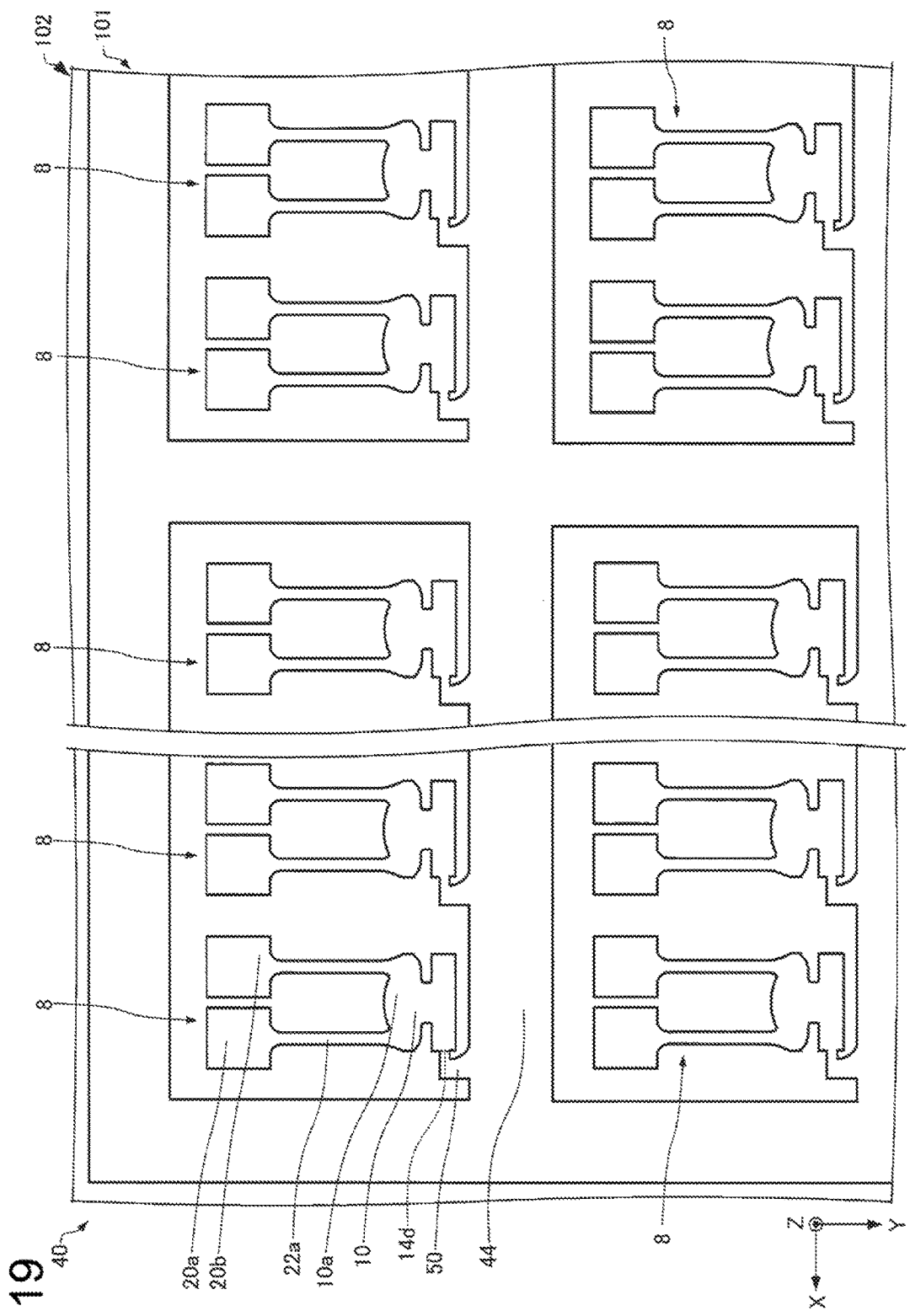
FIG. 19 is a plan view schematically showing a manufacturing step of the resonator element according to the second embodiment.
Figure 20:
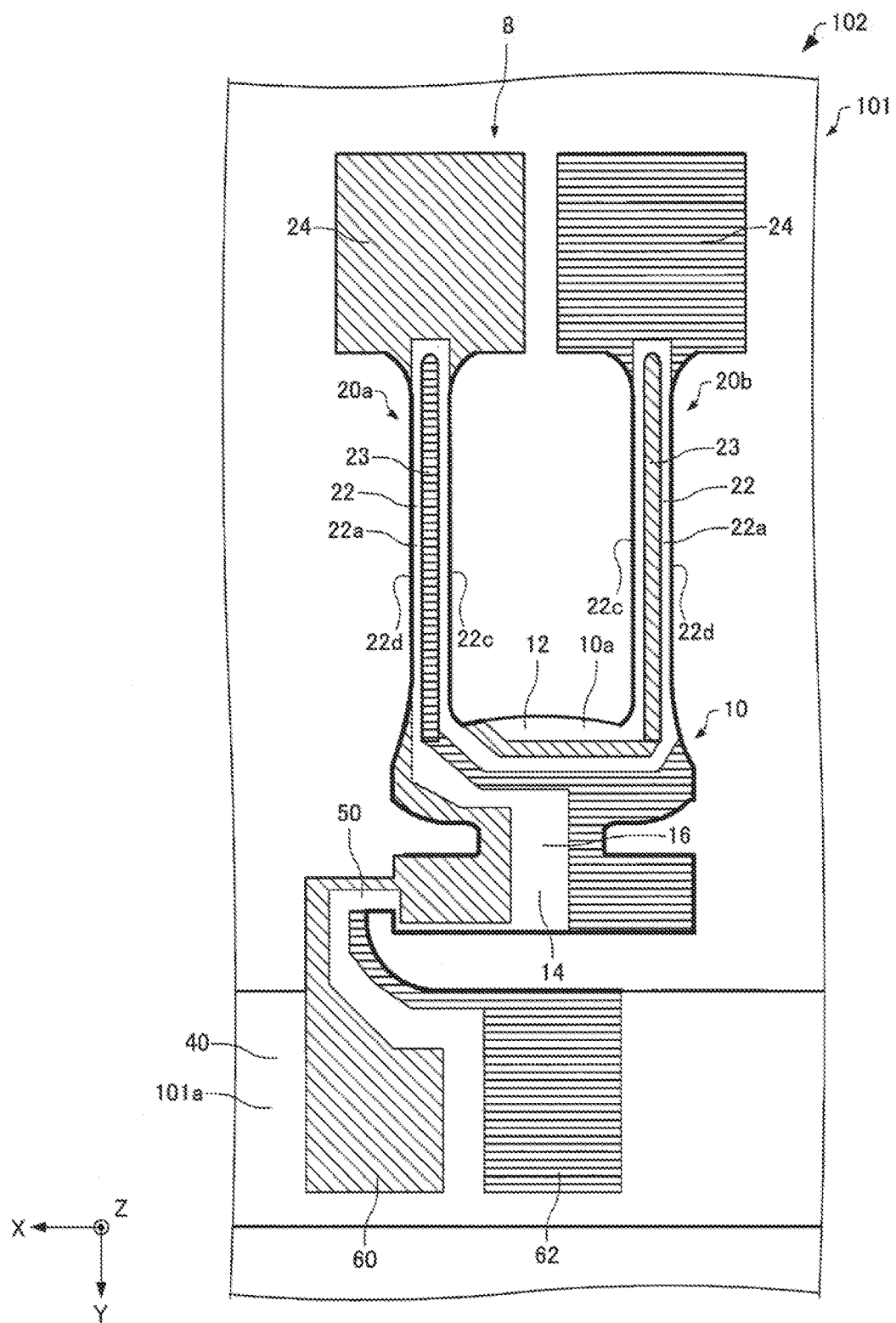
FIG. 20 is a plan view schematically showing a manufacturing step of the resonator element according to the second embodiment.

Next, a method for manufacturing the resonator element 200 according to the second embodiment will be described with reference to the drawings. FIGS. 19 and 20 are plan views schematically showing manufacturing steps of the resonator element 200 according to the second embodiment.

Hereinafter, differences of the method for manufacturing the resonator element 200 according to the second embodiment from the example of the method for manufacturing the resonator element 100 according to the first embodiment will be described, and a description of similarities is omitted.

In the method for manufacturing the resonator element 200, as shown in FIG. 19, the quartz crystal substrate 101 is patterned in the outer shape forming step S1 such that, for example, the frame portion 40 includes extending portions 44 extending in the X-axis direction. The coupling portion 50 couples the extending portion 44 with the base portion 10.

Figure 21:
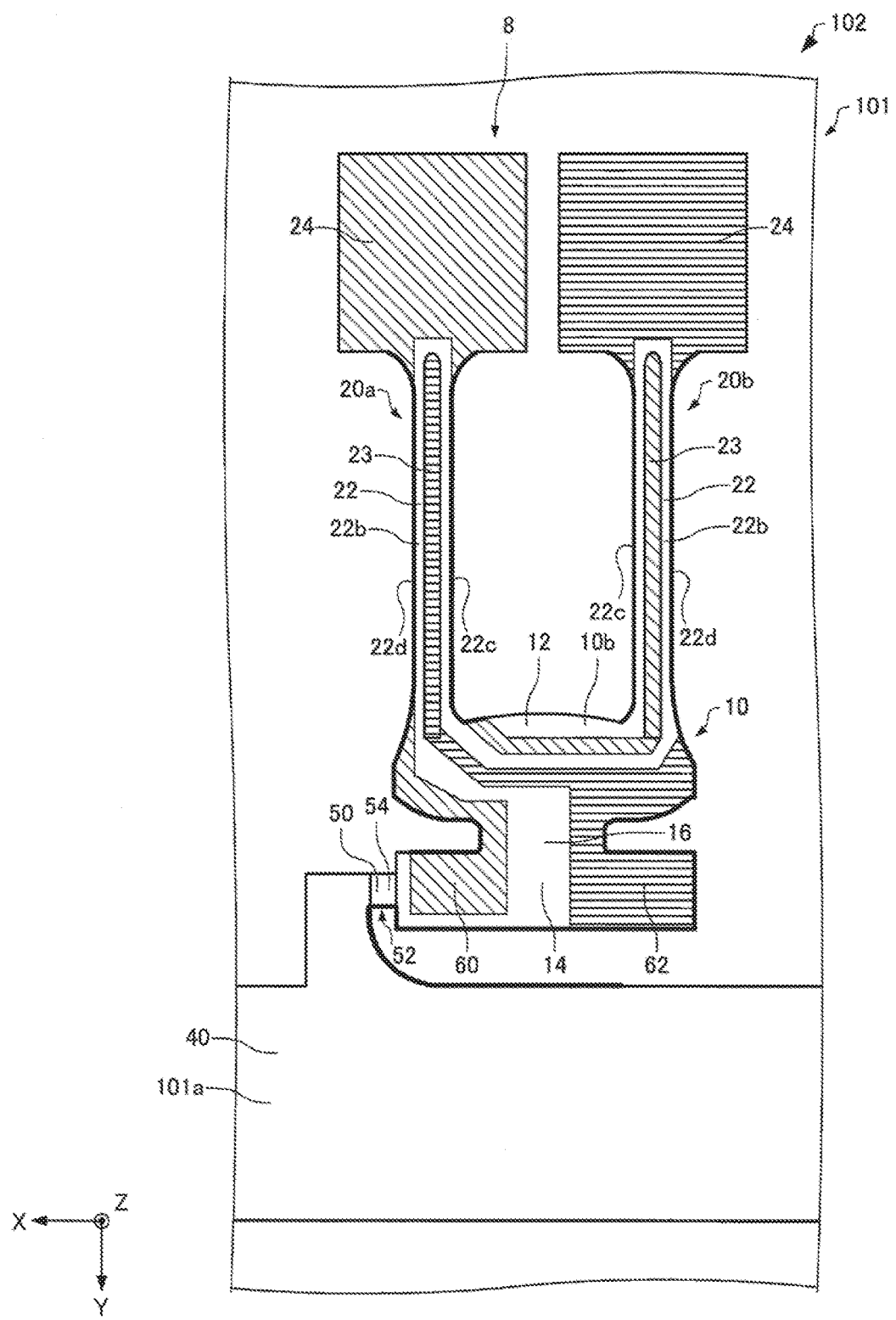
FIG. 21 is a plan view schematically showing a manufacturing step of the resonator element according to the second embodiment.

In the method for manufacturing the resonator element 200, as shown in FIGS. 20 and 21, the first conductive layer 60 is formed in the conductive layer forming step S4 on the frame portion 40, the coupling portion 50, the base portion 10, the side surfaces 22c and 22d of the arm portion 22 of the first vibrating arm 20a, the weight portion 24 of the first vibrating arm 20a, and the inner surface of the second groove portion 23 provided in the second vibrating arm 20b. Further, the second conductive layer 62 is formed on the frame portion 40, the coupling portion 50, the base portion 10, the side surfaces 22c and 22d of the arm portion 22 of the second vibrating arm 20b, the weight portion 24 of the second vibrating arm 20b, and the inner surface of the second groove portion 23 provided in the first vibrating arm 20a.

FIG. 20 is a diagram of the structure 8 viewed from the major surface 101a side, for explaining a configuration of the structure 8 on the major surface 101a side. FIG. 21 is a diagram of the structure 8 viewed in a see-through manner from the major surface 101a side, for explaining a configuration of the structure 8 on the major surface 101b side.

In the example shown in FIGS. 20 and 21, the second conductive layer 62 is provided on the side surface of the second base portion 14 and the side surface of the coupling portion 50. However, as shown in FIGS. 22 and 23, the second conductive layer 62 may be provided so as to avoid the side surface of the second base portion 14 and the side surface of the coupling portion 50.

Figure 22:
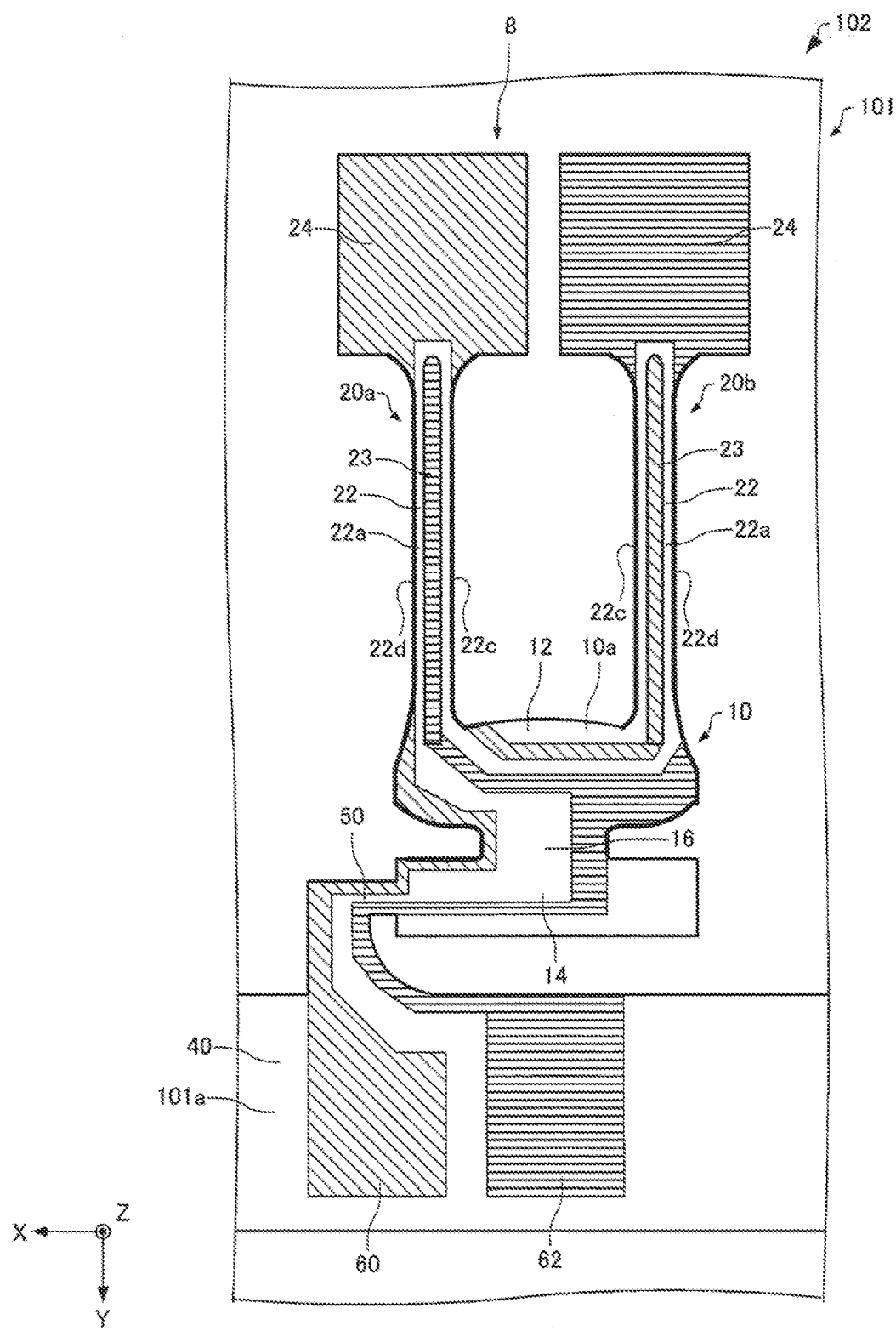
FIG. 22 is a plan view schematically showing a manufacturing step of the resonator element according to the second embodiment.
Figure 23:
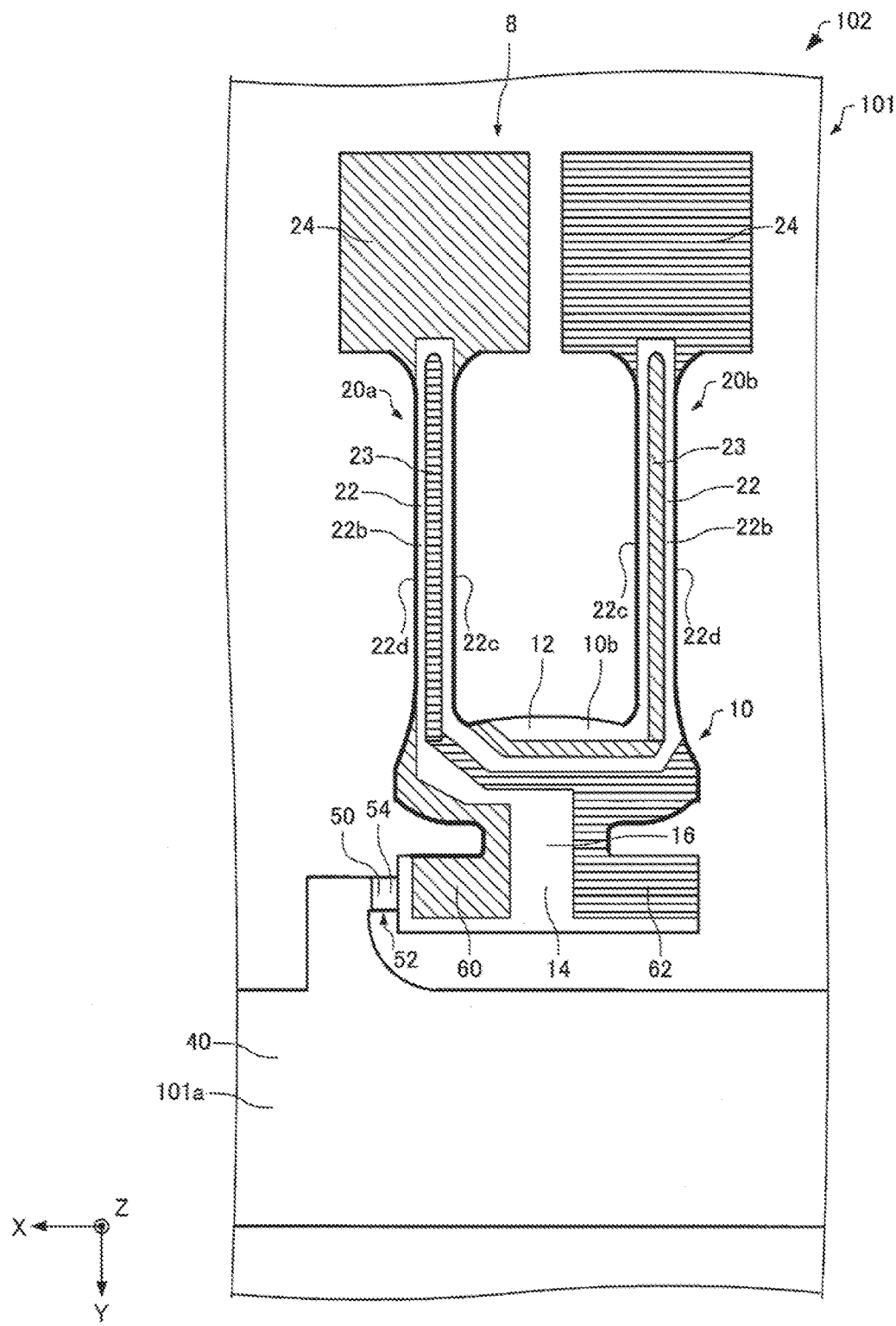
FIG. 23 is a plan view schematically showing a manufacturing step of the resonator element according to the second embodiment.

FIG. 22 is a diagram of the structure 8 viewed from the major surface 101a side, for explaining a configuration of the structure 8 on the major surface 101a side. FIG. 23 is a diagram of the structure 8 viewed in a see-through manner from the major surface 101a side, for explaining a configuration of the structure 8 on the major surface 101b side.

2.3. Modified Examples of Resonator Element 2.3.1. First Modified Example

Figure 24:
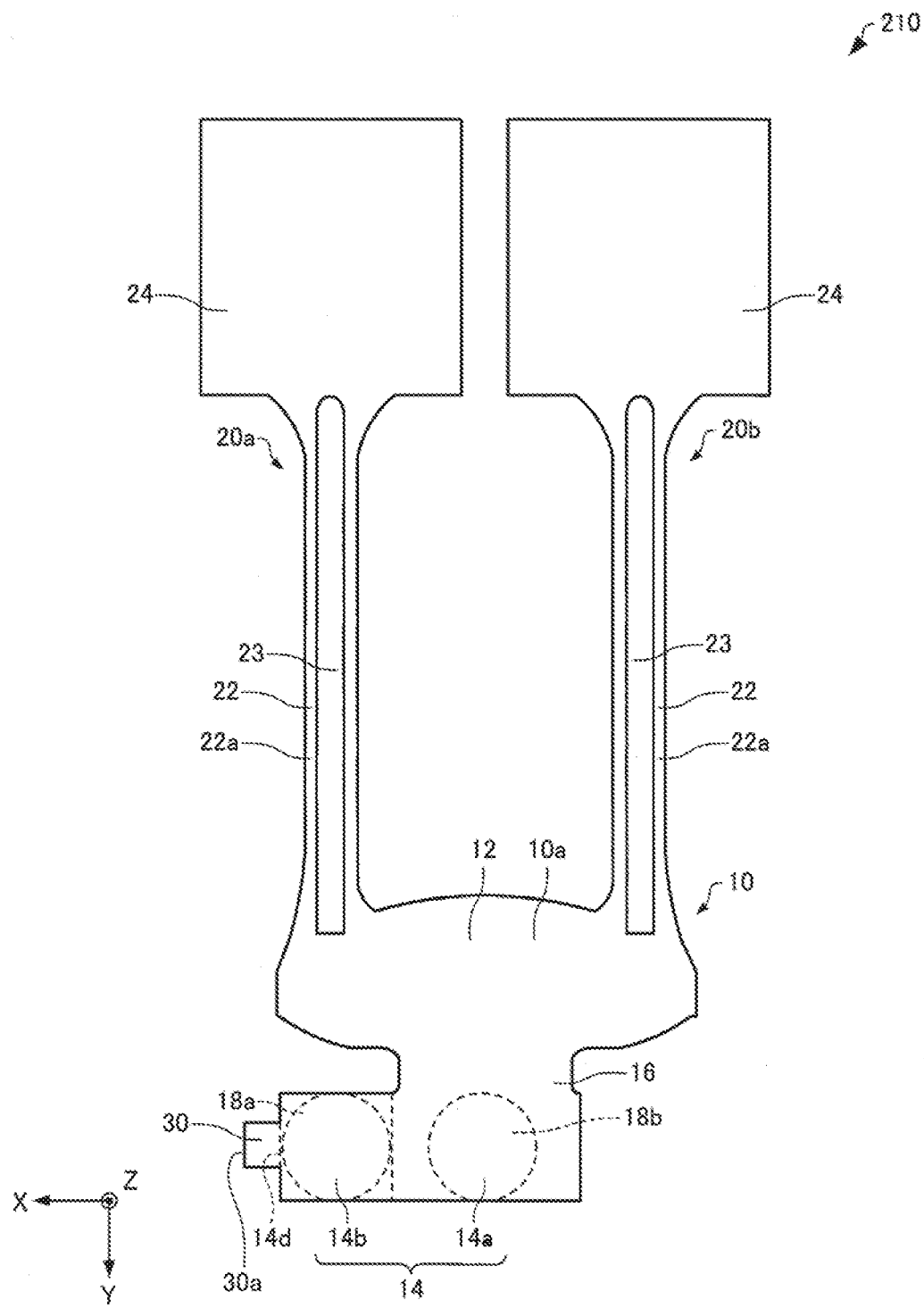
FIG. 24 is a plan view schematically showing a resonator element according to a first modified example of the second embodiment.

Next, a resonator element according to a first modified example of the second embodiment will be described with reference to the drawing. FIG. 24 is a plan view schematically showing the resonator element 210 according to the first modified example of the second embodiment.

Hereinafter, in the resonator element 210 according to the first modified example of the second embodiment, members having functions similar to the constituent members of the resonator element 200 according to the second embodiment are denoted by the same reference numerals and signs, and a detailed description of the members is omitted. The same applies to a resonator element according to a second modified example of the second embodiment shown below.

In the resonator element 200 described above, as shown in FIG. 17, the second base portion 14 includes the first portion 14a, the second portion 14b, and the third portion 14c, the second portion 14b is fixed to the package via the first conductive bonding member 18a, and the third portion 14c is fixed to the package via the second conductive bonding member 18b.

In contrast, in the resonator element 210 as shown in FIG. 24, the second base portion 14 does not include the third portion 14c. In the resonator element 210, the first portion 14a is fixed to the package via the second conductive bonding member 18b, and the second portion 14b is fixed to the package via the first conductive bonding member 18a.

In the resonator element 210, the second base portion 14 does not include the third portion 14c, the first portion 14a is fixed to the package via the second conductive bonding member 18b, and the second portion 14b is fixed to the package via the first conductive bonding member 18a. Hence, in the resonator element 210, a fixing load to the package in the spurious mode (the X-axis-direction in-phase flexural vibration mode) is lessened because two fixed places are close to each other compared with the resonator element 100. Therefore, the resonance frequency of the spurious mode is reduced so as to be away from the resonance frequency of the main mode (the X-axis-direction opposite-phase flexural vibration mode).

2.3.2. Second Modified Example

Figure 25:
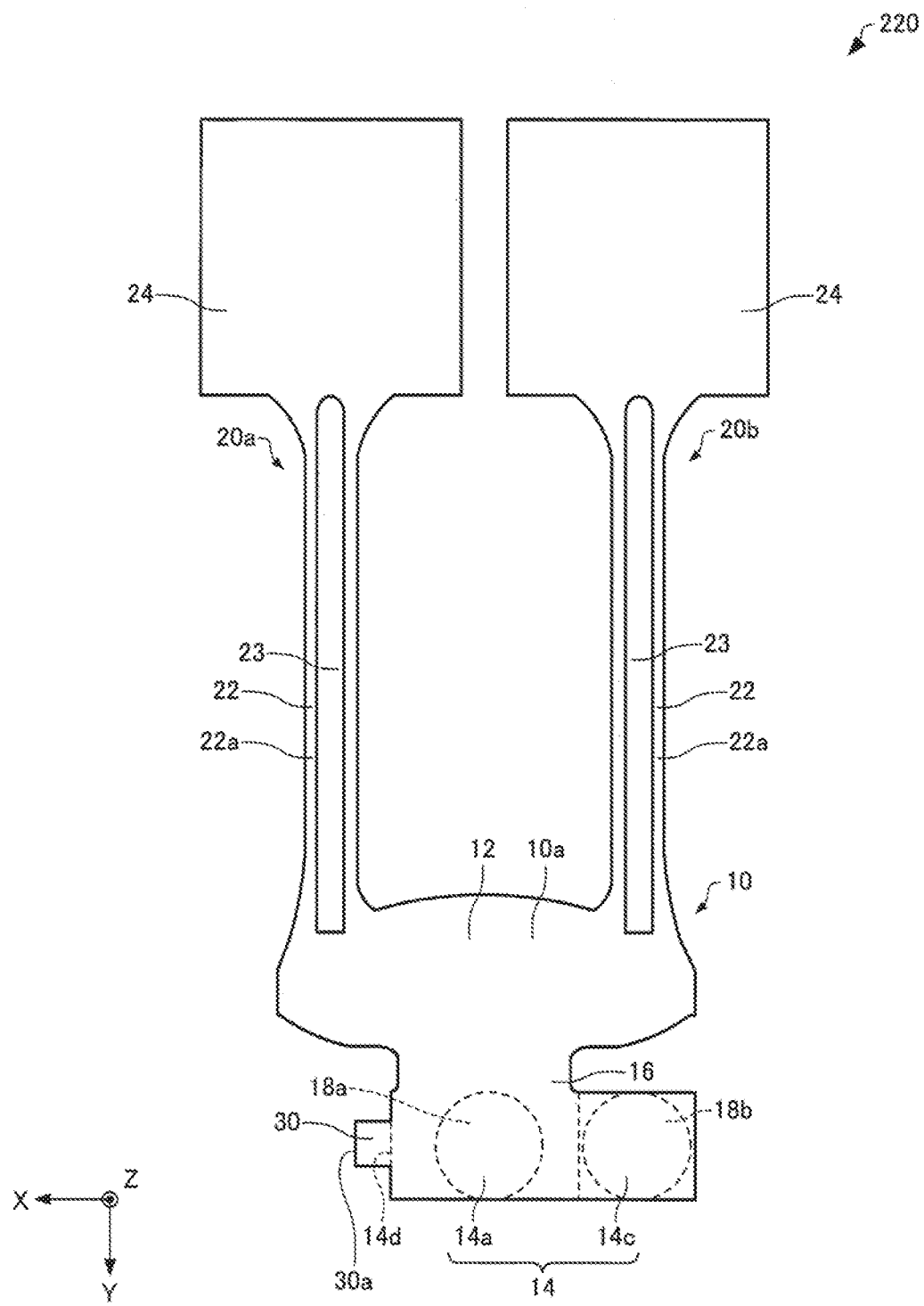
FIG. 25 is a plan view schematically showing a resonator element according to a second modified example of the second embodiment.

Next, the resonator element according to the second modified example of the second embodiment will be described with reference to the drawing. FIG. 25 is a plan view schematically showing the resonator element 220 according to the second modified example of the second embodiment.

In the resonator element 200 described above, as shown in FIG. 17, the second base portion 14 includes the first portion 14*a*, the second portion 14*b*, and the third portion 14*c*, the second portion 14*b* is fixed to the package via the first conductive bonding member 18*a*, and the third portion 14*c* is fixed to the package via the second conductive bonding member 18*b*.

In contrast, in the resonator element 220 as shown in FIG. 25, the second base portion 14 does not include the second portion 14*b*. In the resonator element 220, the first portion 14*a* is fixed to the package via the first conductive bonding member 18*a*, and the third portion 14*c* is fixed to the package via the second conductive bonding member 18*b*. In the resonator element 220, the break-off mark 30 is provided on the side surface 14*d* of the first portion 14*a*.

In the resonator element 220, the second base portion 14 does not include the second portion 14*b*, the first portion 14*a* is fixed to the package via the first conductive bonding member 18*a*, and the third portion 14*c* is fixed to the package via the second conductive bonding member 18*b*. Hence, in the resonator element 220, a fixing load to the package in the spurious mode (the X-axis-direction in-phase flexural vibration mode) is lessened because two fixed places are close to each other compared with the resonator element 100. Therefore, the resonance frequency of the spurious mode is reduced so as to be away from the resonance frequency of the main mode (the X-axis-direction opposite-phase flexural vibration mode).

Further, in the resonator element 220, the break-off mark 30 is provided on the side surface 14*d* of the first portion 14*a* of the second base portion 14. Therefore, it is possible in the resonator element 220 to suppress the breaking of the second base portion 14 in cutting the coupling portion 50.

3. Third Embodiment

Figure 26:
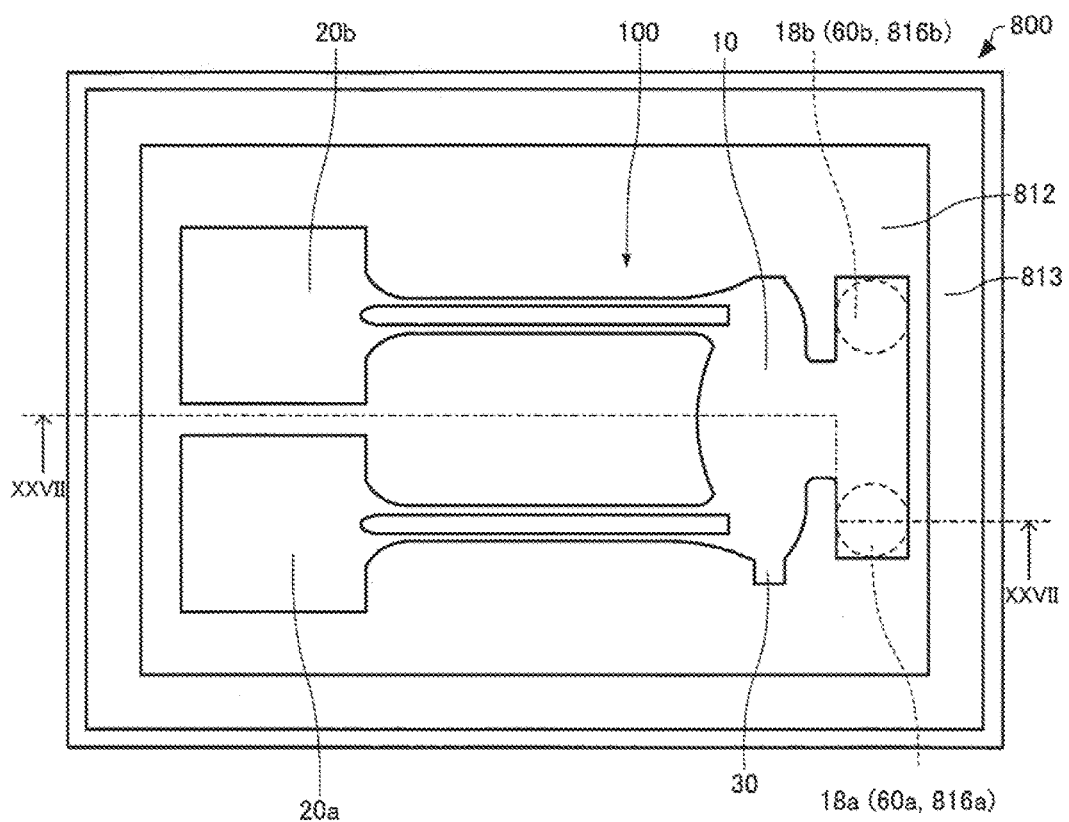
FIG. 26 is a plan view schematically showing a resonator according to a third embodiment.
Figure 27:
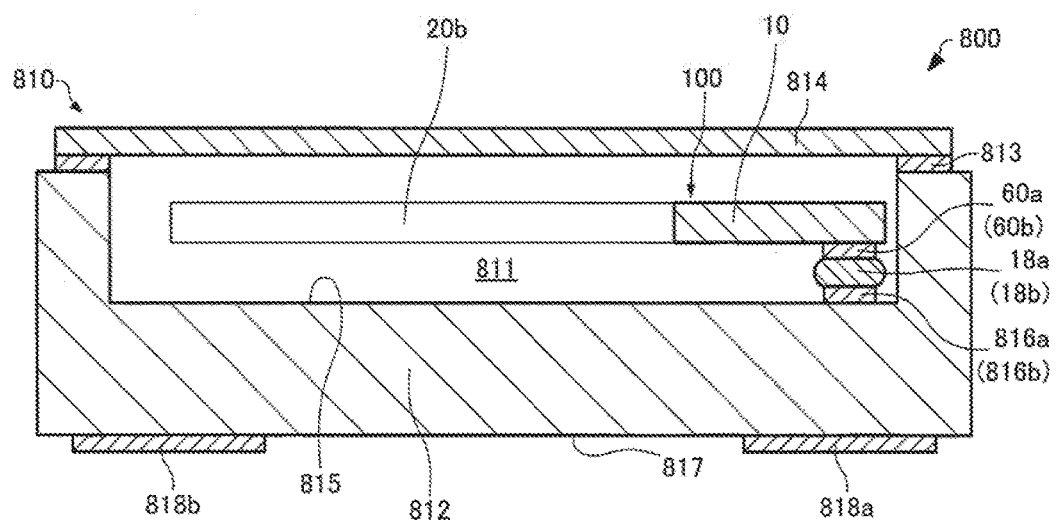
FIG. 27 is a cross-sectional view schematically showing the resonator according to the third embodiment.

Next, a resonator according to a third embodiment will be described with reference to the drawings. FIG. 26 is a plan view schematically showing the resonator 800 according to the third embodiment. FIG. 27 is a cross-sectional view schematically showing the resonator 800 according to the third embodiment, taken along the line XXVII-XXVII of FIG. 26. For convenience sake, a lid 814 is not illustrated in FIG. 26.

The resonator 800 includes a resonator element according to the invention. The resonator 800, which includes the resonator element 100 as a resonator element according to the invention, will be described below. As shown in FIGS. 26 and 27, the resonator 800 includes the resonator element 100 and a package (container) 810.

The package 810 includes a base 812 having a box shape and including a recess 811 that is opened in the upper surface, and the lid 814 having a plate shape and bonded to the base 812 so as to close an opening of the recess 811. The package 810 includes an accommodating space formed by closing the recess 811 with the lid 814, and the resonator element 100 is hermetically accommodated and placed in the accommodating space. That is, the resonator element 100 is contained in the package 810.

For example, a reduced-pressure (vacuum) state may be established in the accommodating space (the recess 811) in which the resonator element 100 is contained, or an inert gas such as nitrogen, helium, or argon may be sealed therein. Due to this, the vibration characteristics of the resonator element 100 are improved.

The material of the base 812 is, for example, a ceramic-based insulating material, such as an aluminum oxide sintered body, a mullite sintered body, an aluminum nitride sintered body, a silicon carbide sintered body, or a glass ceramic sintered body, obtained by molding, stacking, and baking ceramic green sheets, quartz crystal, glass, silicon (high-resistance silicon), or the like. The material of the lid 814 is the same material as the base 812, or a metal such as Kovar or Alloy 42.

The bonding between the base 812 and the lid 814 is performed by providing a seal ring 813 on the base 812, placing the lid 814 on the seal ring 813, and welding the seal ring 813 to the base 812 using, for example, a resistance welding machine. The bonding between the base 812 and the lid 814 is not particularly limited, and may be performed using an adhesive or may be performed by seam welding.

On an inner bottom surface (inside bottom surface) 815 of the recess 811 of the base 812, internal terminals 816*a* and 816*b* are provided at positions facing electrode pads 60*a* and 60*b* that are electrically connected with the drive electrodes (not shown) of the resonator element 100. The electrode pad 60*a* is bonded to the internal terminal 816*a* via the conductive bonding member 18*a*, and the electrode pad 60*b* is bonded to the internal terminal 816*b* via the conductive bonding member 18*b*.

Electrode terminals 818*a* and 818*b* are provided on an outer bottom surface (outside bottom surface) 817 of the base 812 on the side opposite to the inner bottom surface 815. The electrode terminals 818*a* and 818*b* are electrically connected with the internal terminals 816*a* and 816*b* through internal wiring (not shown). Specifically, the electrode terminal 818*a* is electrically connected with the internal terminal 816*a*, and the electrode terminal 818*b* is electrically connected with the internal terminal 816*b*. The internal terminals 816*a* and 816*b* and the electrode terminals 818*a* and 818*b* are, for example, metal coatings in which a coating such as nickel or gold is stacked on a metallization layer such as tungsten or molybdenum by plating or the like.

Although not illustrated, the package 810 may include the base 812 having a flat-plate shape and the lid 814 including a recess. Moreover, the package 810 may be provided with a recess in each of the base 812 and the lid 814.

In the resonator 800, with, for example, a drive signal applied via the electrode terminals 818*a* and 818*b* from an oscillation circuit integrated in an IC chip of an electronic apparatus, the resonator element 100 is excited to flexurally vibrate and resonate (oscillate) at a predetermined frequency, and outputs a resonance signal (oscillation signal) from the electrode terminals 818*a* and 818*b*.

Since the resonator 800 includes the resonator element 100, miniaturization can be achieved.

In a method for manufacturing the resonator 800, the resonator element 100 is mounted on the base 812 with the conductive bonding members 18*a* and 18*b* between the resonator element 100 and the base 812, and thereafter, the resonance frequency of the resonator element 100 is measured. In the method for manufacturing the resonator element 100, as described above, the coupling portion 50 is formed so as to extend to the frame portion 40 from only the side surface 12*a* of the base portion 10 crossing the X-axis direction. Therefore, it is possible to reduce the difference between the resonance frequency of the resonator element 100 mounted on the base 812 and the resonance frequency of the structure 8 in the wafer 102.

4. Fourth Embodiment

Figure 28:
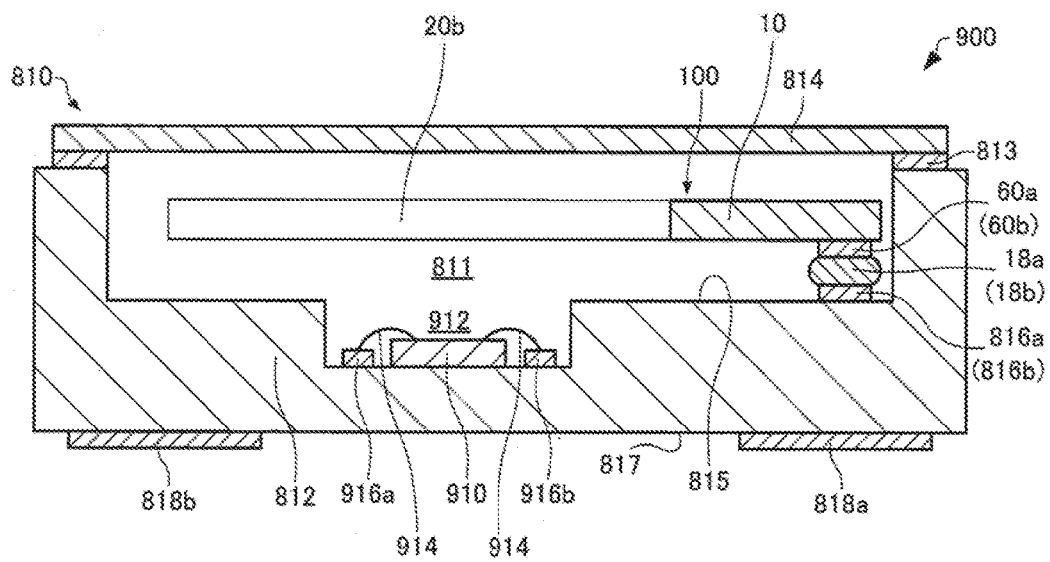
FIG. 28 is a cross-sectional view schematically showing an oscillator according to a fourth embodiment.

Next, an oscillator according to a fourth embodiment will be described with reference to the drawing. FIG. 28 is a cross-sectional view schematically showing the oscillator 900 according to the embodiment.

Hereinafter, in the oscillator 900 according to the fourth embodiment, members having functions similar to the constituent members of the resonator 800 according to the third embodiment are denoted by the same reference numerals and signs, and a detailed description of the members is omitted.

The oscillator 900 includes a resonator element according to the invention. The oscillator 900, which includes the resonator element 100 as a resonator element according to the invention, will be described below. As shown in FIG. 28, the oscillator 900 includes the resonator element 100, the package 810, and an IC chip 910.

A containing portion 912 formed in a recessed shape is provided in the inner bottom surface 815 of the base 812. The IC chip 910 is contained in the containing portion 912. The IC chip 910 incorporates an oscillation circuit. The IC chip 910 is fixed to the bottom surface of the containing portion 912 by means of an adhesive (not shown) or the like.

The IC chip 910 is connected by means of wires 914 such as gold or aluminum with internal connection terminals 916a and 916b provided on the bottom surface of the containing portion 912. The internal connection terminals 916a and 916b are, for example, metal coatings in which a coating such as nickel or gold is stacked on a metallization layer such as tungsten or molybdenum by plating or the like. The internal connection terminals 916a and 916b are connected to the electrode terminals 818a and 818b and the internal terminals 816a and 816b via internal wiring (not shown). That is, the IC chip (oscillation circuit) 910 is electrically connected with the resonator element 100.

Although not illustrated, a connection method through flip-chip mounting with the IC chip 910 inverted, or the like may be used, other than the connection method through wire bonding using the wires 914, for the connection between the IC chip 910 and the internal connection terminals 916a and 916b. Moreover, the IC chip 910 may be mounted in a recess provided in the outer bottom surface 817 of the base 812, and sealed therein by means of a molding material.

In the oscillator 900, with, for example, a drive signal applied from the IC chip 910 via the internal connection terminals 916a and 916b, the internal terminals 816a and 816b, and the like, the resonator element 100 is excited to flexurally vibrate and resonate (oscillate) at a predetermined frequency. The oscillator 900 outputs an oscillation signal generated in association with this oscillation to the outside via the IC chip 910, the electrode terminals 818a and 818b, and the like.

Since the oscillator 900 includes the resonator element 100, miniaturization can be achieved.

5. Fifth Embodiment

Figure 29:
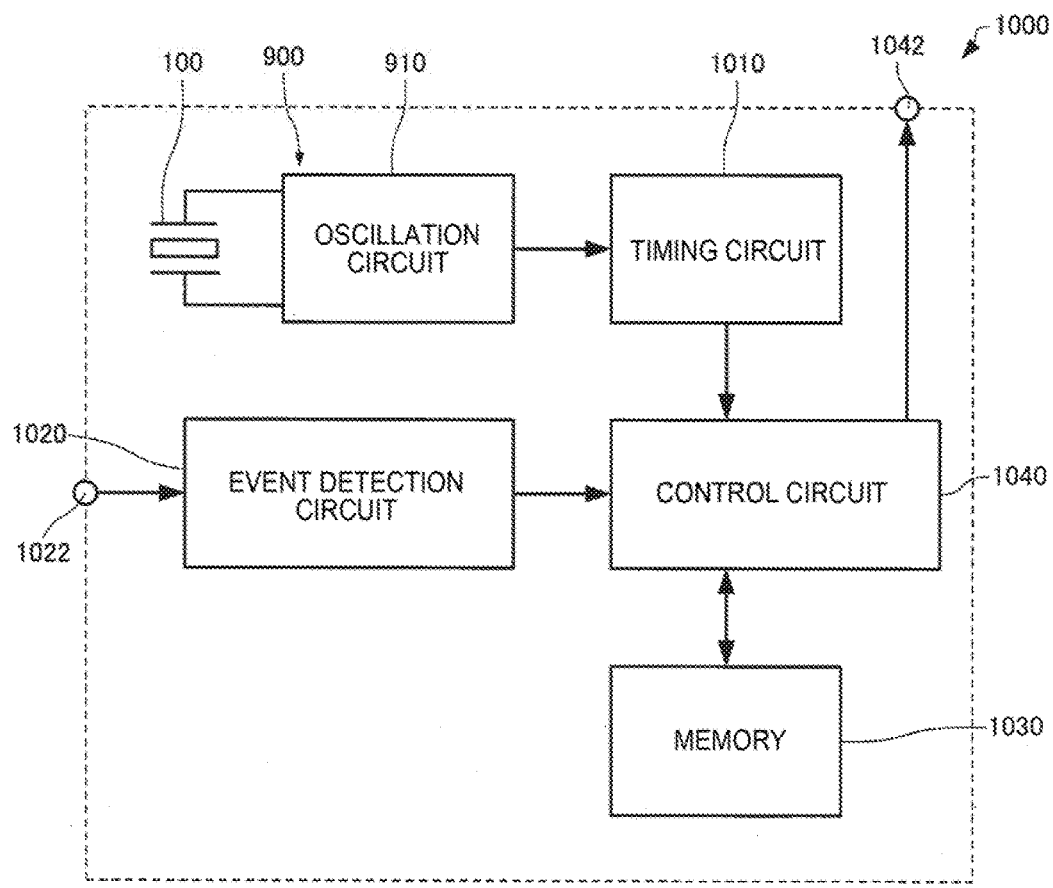
FIG. 29 is a functional block diagram of a real-time clock according to a fifth embodiment.

Next, a real-time clock according to a fifth embodiment will be described with reference to the drawing. FIG. 29 is a functional block diagram of the real-time clock 1000 according to the fifth embodiment.

The real-time clock 1000 includes an oscillator according to the invention. The real-time clock 1000, which includes the oscillator 900 as an oscillator according to the invention, will be described below. As shown in FIG. 29, the real-time clock 1000 includes the oscillator 900, a timing circuit 1010, an event detection circuit 1020, a memory 1030, and a control circuit 1040.

The oscillator 900 includes the resonator element 100 and the oscillation circuit (IC chip) 910 electrically connected with the resonator element 100. The resonator element 100 vibrates at a predetermined frequency in response to an electric signal input thereto via the oscillation circuit 910. The oscillation circuit 910 amplifies the signal output from the resonator element 100, and outputs the amplified signal.

The oscillator 900 is connected to the timing circuit 1010. The timing circuit 1010 obtains a frequency of 1 [Hz] by frequency division of the signal output from the oscillator 900, and counts the year, month, day, hour, minute, and second with respective timing registers (not shown) using this signal of 1 [Hz]. That is, the timing circuit 1010 generates date-time data based on the signal output from the oscillation circuit 910 of the oscillator 900. With the inclusion of the timing circuit 1010, time-of-day data can be obtained, and thus the date, time, and the like upon the occurrence of an event (every event detection period) can be recorded in the memory 1030. Depending on settings, the timing circuit 1010 can store data on day of week in addition to the year, month, day, hour, minute, and second.

The event detection circuit 1020 is connected to an event input terminal 1022 that is an external terminal of the real-time clock 1000. When an electric signal indicating that an event has occurred is input to the event input terminal 1022, the event detection circuit 1020 sets an event occurrence flag. The occurrence of an event is indicated by a flag in this manner, so that the presence or absence of an event can be determined based on the flag. Specifically, the event detection circuit 1020 sets the event occurrence flag to 1 (changes from 0 to 1).

The memory 1030 is a storage means that records the time-of-day data described above or data on the occurrence of an event.

The timing circuit 1010, the event detection circuit 1020, the memory 1030, and an interrupt output terminal 1042 as an external terminal are connected to the control circuit 1040. The control circuit 1040 can read, from the timing circuit 1010, the data of the time of day when the setting of a flag has been detected, based on flag information input from the event detection circuit 1020.

The interrupt output terminal 1042 has roles, when any event is input, in recording time-of-day data or data on the occurrence of the event and also outputting a signal to a CPU in an interruptive manner.

Since the real-time clock 1000 includes the resonator element 100, miniaturization can be achieved.

6. Sixth Embodiment

Next, electronic apparatuses according to a sixth embodiment will be described with reference to the drawings. The electronic apparatuses according to the sixth embodiment include a resonator element according to the invention. The electronic apparatuses, which include the resonator element 100 as a resonator element according to the invention, will be described below.

Figure 30:
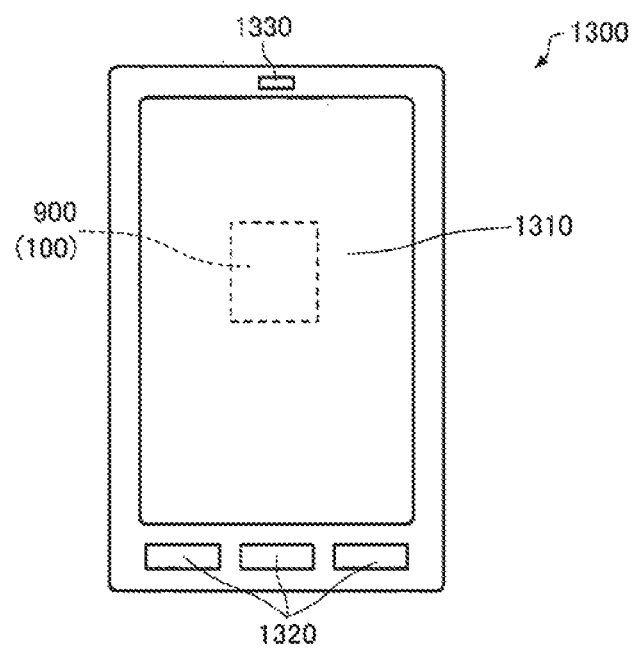
FIG. 30 is a plan view schematically showing an electronic apparatus according to a sixth embodiment.

FIG. 30 is a plan view schematically showing a smartphone 1300 as an electronic apparatus according to the sixth embodiment. As shown in FIG. 30, the smartphone 1300 includes the oscillator 900 including the resonator element 100.

The smartphone 1300 uses the oscillator 900 as, for example, a timing device such as a reference clock oscillation source. The smartphone 1300 can further include a display portion (a liquid crystal display, an organic EL display, etc.) 1310, operating portions 1320, and a sound output portion 1330 (a microphone, etc.). The smartphone 1300 may be provided with a touch detecting mechanism for the display portion 1310, so that the display portion 1310 serves also as an operating portion.

The electronic apparatus represented by the smartphone 1300 preferably includes an oscillation circuit that drives the resonator element 100 and a temperature compensation circuit that compensates for frequency variations associated with changes in the temperature of the resonator element 100.

According to this configuration, since the electronic apparatus represented by the smartphone 1300 includes the oscillation circuit that drives the resonator element 100 and the temperature compensation circuit that compensates for frequency variations associated with changes in the temperature of the resonator element 100, the resonance frequency at which the oscillation circuit oscillates can be temperature-compensated, and thus it is possible to provide the electronic apparatus having excellent temperature characteristics.

Figure 31:
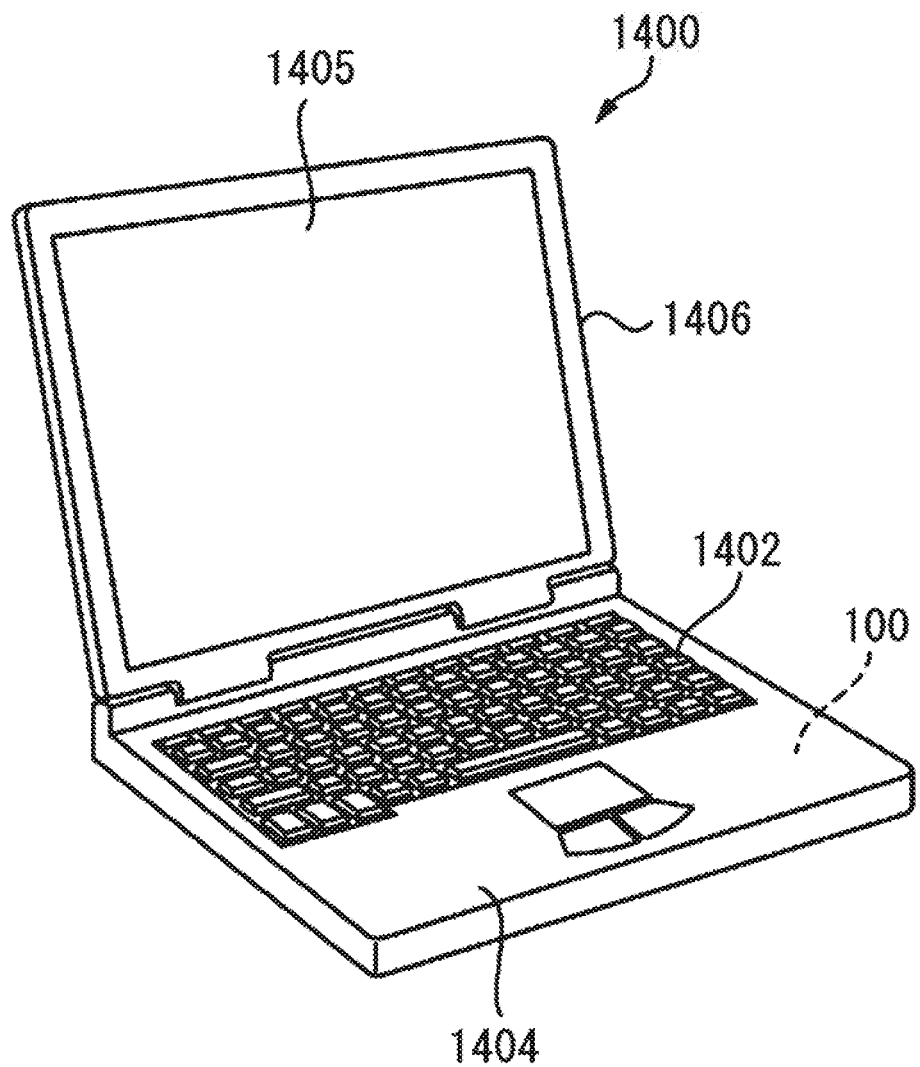
FIG. 31 is a perspective view schematically showing an electronic apparatus according to the sixth embodiment.

FIG. 31 is a perspective view schematically showing a mobile (or notebook) personal computer 1400 as an electronic apparatus according to the sixth embodiment. As shown in FIG. 31, the personal computer 1400 is composed of a main body portion 1404 including a keyboard 1402, and a display unit 1406 including a display portion 1405. The display unit 1406 is rotatably supported to the main body portion 1404 via a hinge structure portion. The resonator element 100, which functions as a filter, a resonator, a reference clock, or the like, is incorporated into the personal computer 1400.

Figure 32:
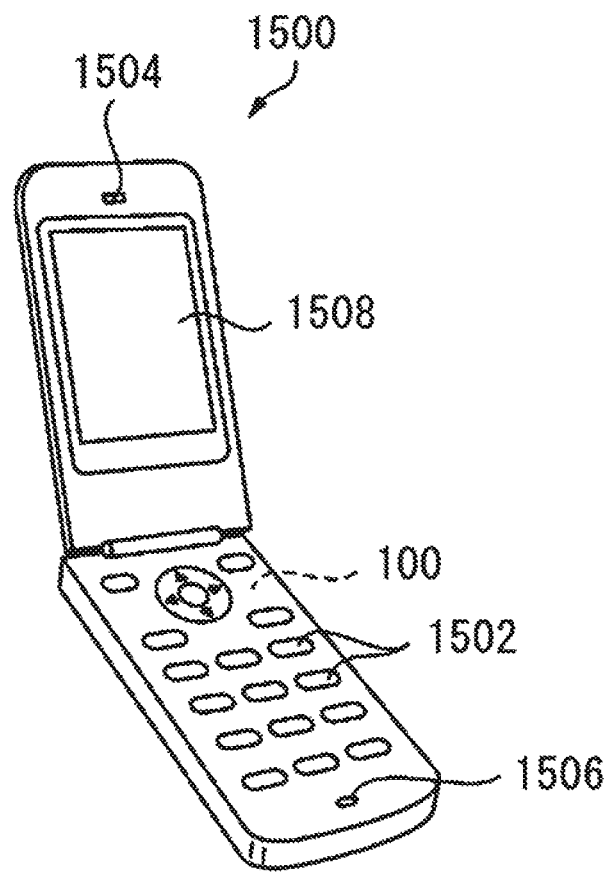
FIG. 32 is a perspective view schematically showing an electronic apparatus according to the sixth embodiment.

FIG. 32 is a perspective view schematically showing a mobile phone (including a PHS) 1500 as an electronic apparatus according to the sixth embodiment. The mobile phone 1500 includes a plurality of operating buttons 1502, an earpiece 1504, and a mouthpiece 1506. A display portion 1508 is disposed between the operating buttons 1502 and the earpiece 1504. The resonator element 100, which functions as a filter, a resonator, or the like, is incorporated into the mobile phone 1500.

Figure 33:
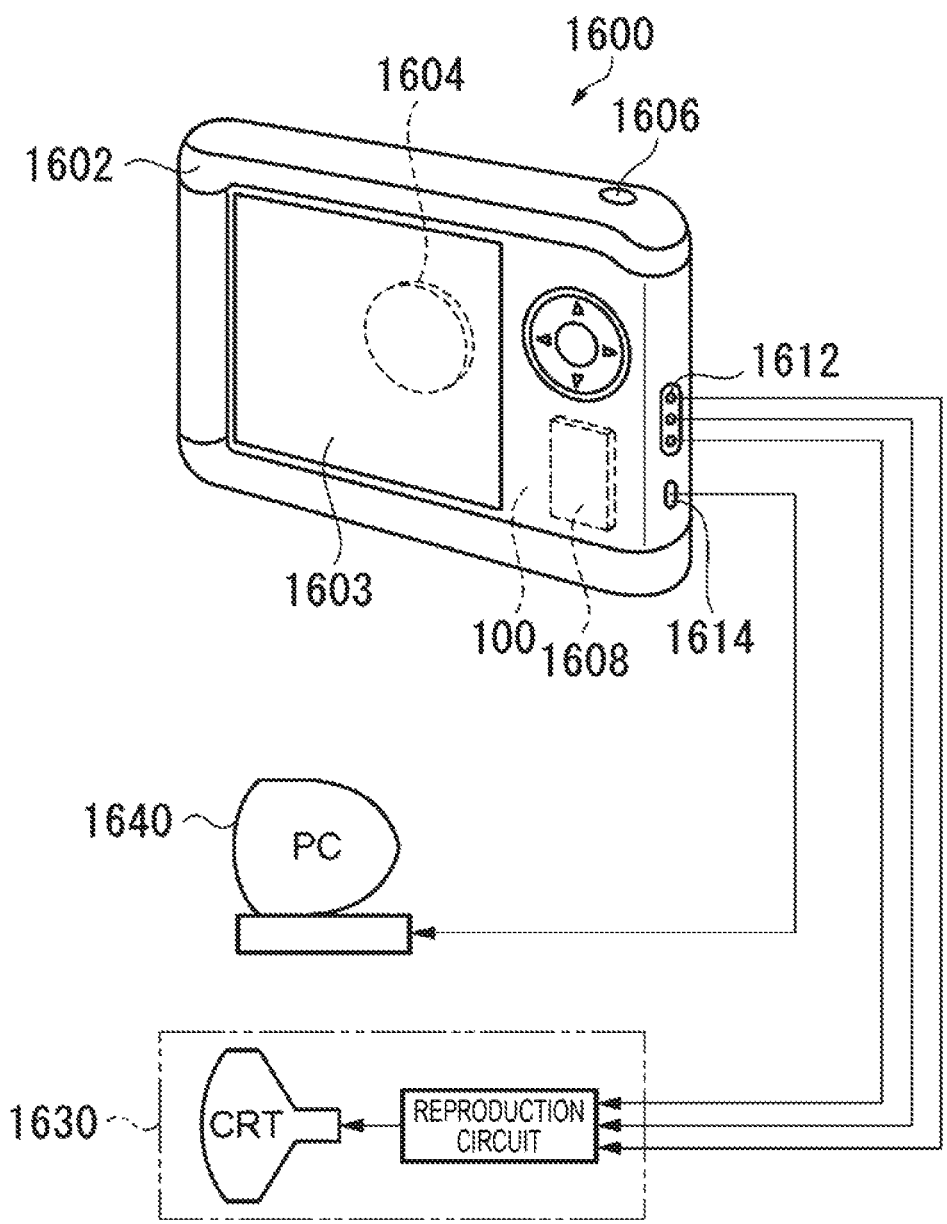
FIG. 33 is a perspective view schematically showing an electronic apparatus according to the sixth embodiment.

FIG. 33 is a perspective view schematically showing a digital still camera 1600 as an electronic apparatus according to the sixth embodiment. In FIG. 33, connections with external apparatuses are also shown in a simplified manner. Here, usual cameras expose a silver halide photographic film with an optical image of a subject, whereas the digital still camera 1600 photoelectrically converts the optical image of the subject with an imaging device such as a CCD (Charge Coupled Device) to generate imaging signals (image signals).

A display portion 1603 is provided on the back surface of a case (body) 1602 in the digital still camera 1600, and configured to perform display based on the imaging signals generated by the CCD. The display portion 1603 functions as a finder that displays the subject as an electronic image. Moreover, on the front side (the rear side in the drawing) of the case 1602, a light receiving unit 1604 including an optical lens (imaging optical system) and the CCD is provided.

When a photographer confirms the subject image displayed on the display portion and presses down a shutter button 1606, imaging signals of the CCD at the time are transferred to and stored in a memory 1608. In the digital still camera 1600, a video signal output terminal 1612 and a data communication input/output terminal 1614 are provided on a side surface of the case 1602. Then, as shown in the drawing, a television monitor 1630 and a personal computer 1640 are connected as necessary to the video signal output terminal 1612 and the data communication input/output terminal 1614, respectively. Further, the imaging signals stored in the memory 1608 are output to the television monitor 1630 or the personal computer 1640 by a predetermined operation. The resonator element 100, which functions as a filter, a resonator, or the like, is incorporated into the digital still camera 1600.

Since the electronic apparatuses 1300, 1400, 1500, and 1600 include the resonator element 100, miniaturization can be achieved.

An electronic apparatus including a resonator element according to the invention is not limited to the examples described above, and can be applied to, for example, an inkjet ejection device (e.g., an inkjet printer), a laptop personal computer, a television set, a video camcorder, a video tape recorder, a car navigation system, a pager, an electronic notebook (including one with communication function), an electronic dictionary, an calculator, an electronic game console, a word processor, a workstation, a videophone, a surveillance television monitor, electronic binoculars, a POS terminal, a medical device (e.g., an electronic thermometer, a sphygmomanometer, a blood glucose meter, an electrocardiogram measuring system, an ultrasonic diagnosis apparatus, and an electronic endoscope), a fishfinder, various types of measuring instrument, indicators (e.g., indicators used in a vehicle, aircraft, and a ship), and a flight simulator.

7. Seventh Embodiment

Figure 34:
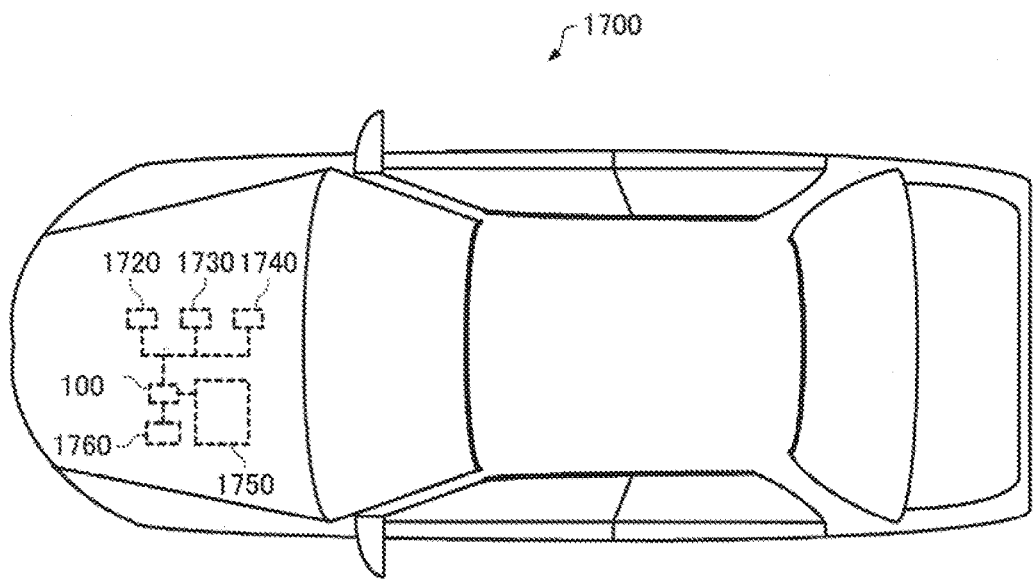
FIG. 34 is a plan view schematically showing a moving object according to a seventh embodiment.

Next, a moving object according to a seventh embodiment will be described with reference to the drawing. FIG. 34 is a plan view schematically showing an automobile as the moving object 1700 according to the seventh embodiment.

The moving object according to the seventh embodiment includes a resonator element according to the invention. The moving object, which includes the resonator element 100 as a resonator element according to the invention, will be described below.

The moving object 1700 according to the seventh embodiment is configured to further include a controller 1720, a controller 1730, and a controller 1740 that perform various kinds of control such as for an engine system, a brake system, and a keyless entry system, a battery 1750, and a backup battery 1760. A portion of the components (parts) shown in FIG. 34 maybe omitted or changed in the moving object 1700 according to the embodiment, or another component may be added to the components.

Various types of moving objects are considered as the moving object 1700, and examples thereof include, for example, an automobile (including an electric car), aircraft such as a jet plane or a helicopter, a ship, a rocket, and an artificial satellite.

The embodiments and modified examples described above are merely examples, and the invention is not limited to these examples. For example, each of the embodiments and each of the modified examples can be appropriately combined together.

The invention includes a configuration (e.g., a configuration having the same function, method, and result, or a configuration having the same advantage and advantageous effect) that is substantially the same as those described in the embodiments. Moreover, the invention includes a configuration in which a non-essential portion of the configurations described in the embodiments is replaced. Moreover, the invention includes a configuration providing the same operational effects as those described in the embodiments, or a configuration capable of achieving the same advantages. Moreover, the invention includes a configuration in which a publicly known technique is added to the configurations described in the embodiments.

The entire disclosure of Japanese Patent Application No.: 2015-023452, filed Feb. 9, 2015 is expressly incorporated by reference herein.

What is claimed is:

1. A resonator element comprising:
   a base portion;
   a pair of vibrating arms extending from the base portion along a first direction; and
   a break-off mark located on only one edge side of the base portion in a direction along a second direction orthogonal to the first direction in the plan view.

2. The resonator element according to claim 1, wherein the base portion includes
   a first base portion to which the vibrating arms are connected,
   a second base portion, and
   a constricted portion interposed between the first base portion and the second base portion and located on the side of the first base portion opposite to the side thereof on which the vibrating arms are connected in the plan view, and
   a width of the constricted portion along the second direction is narrower than a width of the first base portion along the second direction and smaller than a width of the second base portion along the second direction.

3. The resonator element according to claim 2, wherein the break-off mark is located on the first base portion.

4. The resonator element according to claim 2, wherein the break-off mark is located on the second base portion.

5. The resonator element according to claim 1, wherein the break-off mark includes a thinned portion with a thickness thinner than a thickness of the base portion.

6. The resonator element according to claim 1, wherein the edge includes a portion inclined to a major surface of the base portion.

7. The resonator element according to claim 1, wherein the edge is a surface of the base portion on a positive X-axis direction side of an X-axis as an electrical axis that is a crystal axis of quartz crystal.

8. The resonator element according to claim 1, wherein the vibrating arm includes
   an arm portion connected to the base portion, and
   a weight portion connected to the arm portion.

9. The resonator element according to claim 8, wherein a width of the weight portion along the second direction is greater than a width of the arm portion along the second direction.

10. The resonator element according to claim 1, wherein the vibrating arm includes a groove portion along the first direction.

11. A resonator comprising:
    the resonator element according to claim 1; and
    a package in which the resonator element is contained.

12. An oscillator comprising:
    the resonator element according to claim 1; and
    an oscillation circuit electrically connected with the resonator element.

13. A real-time clock comprising:
    the resonator element according to claim 1;
    an oscillation circuit electrically connected with the resonator element; and
    a timing circuit generating date-time data based on a signal output from the oscillation circuit.

14. An electronic apparatus comprising the resonator element according to claim 1.

15. A moving object comprising the resonator element according to claim 1.

* * * * *